(12) United States Patent
Chan et al.

(10) Patent No.: US 11,264,505 B2
(45) Date of Patent: Mar. 1, 2022

(54) FINFET DEVICE AND METHOD OF FORMING SAME

(71) Applicant: Taiwan Semiconductor Manufacturing Co., Ltd., Hsinchu (TW)

(72) Inventors: Chia-Ling Chan, New Taipei (TW); Yen-Chun Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/027,078

(22) Filed: Sep. 21, 2020

(65) Prior Publication Data
US 2021/0013337 A1    Jan. 14, 2021

Related U.S. Application Data

(63) Continuation of application No. 16/122,793, filed on Sep. 5, 2018, now Pat. No. 10,784,377.

(60) Provisional application No. 62/566,035, filed on Sep. 29, 2017.

(51) Int. Cl.
| | |
|---|---|
| H01L 29/78 | (2006.01) |
| H01L 21/22 | (2006.01) |
| H01L 29/66 | (2006.01) |
| H01L 29/06 | (2006.01) |
| H01L 29/08 | (2006.01) |
| H01L 23/532 | (2006.01) |
| H01L 29/423 | (2006.01) |
| H01L 21/768 | (2006.01) |
| H01L 21/308 | (2006.01) |
| H01L 21/8238 | (2006.01) |
| H01L 21/324 | (2006.01) |

(52) U.S. Cl.
CPC ............ *H01L 29/785* (2013.01); *H01L 21/22* (2013.01); *H01L 21/3086* (2013.01); *H01L 21/324* (2013.01); *H01L 21/76832* (2013.01); *H01L 21/823821* (2013.01); *H01L 21/823878* (2013.01); *H01L 23/5329* (2013.01); *H01L 29/0649* (2013.01); *H01L 29/0847* (2013.01); *H01L 29/42356* (2013.01); *H01L 29/6656* (2013.01); *H01L 29/66545* (2013.01); *H01L 29/66795* (2013.01); *H01L 29/7833* (2013.01); *H01L 21/823814* (2013.01)

(58) Field of Classification Search
None
See application file for complete search history.

(56) References Cited

U.S. PATENT DOCUMENTS

| | | |
|---|---|---|
| 9,640,640 B1 | 5/2017 | Doris et al. |
| 9,935,199 B2 | 4/2018 | Ching et al. |
| 10,115,808 B2 | 10/2018 | Lin et al. |
| 10,170,555 B1 * | 1/2019 | Liao .................. H01L 29/66545 |
| 2018/0151706 A1 | 5/2018 | Lin et al. |

(Continued)

*Primary Examiner* — Hsien Ming Lee
(74) *Attorney, Agent, or Firm* — Slater Matsil, LLP

(57) ABSTRACT

A method includes forming a fin over a substrate, forming a dummy gate structure over the fin, forming a first spacer over the dummy gate structure, implanting a first dopant in the fin to form a doped region of the fin adjacent the first spacer, removing the doped region of the fin to form a first recess, wherein the first recess is self-aligned to the doped region, and epitaxially growing a source/drain region in the first recess.

20 Claims, 50 Drawing Sheets

(56) References Cited

U.S. PATENT DOCUMENTS

| 2019/0006465 A1 | 1/2019 | Liao et al. |
| 2019/0206743 A1 | 7/2019 | Zang et al. |
| 2019/0214487 A1 | 7/2019 | Li et al. |

* cited by examiner

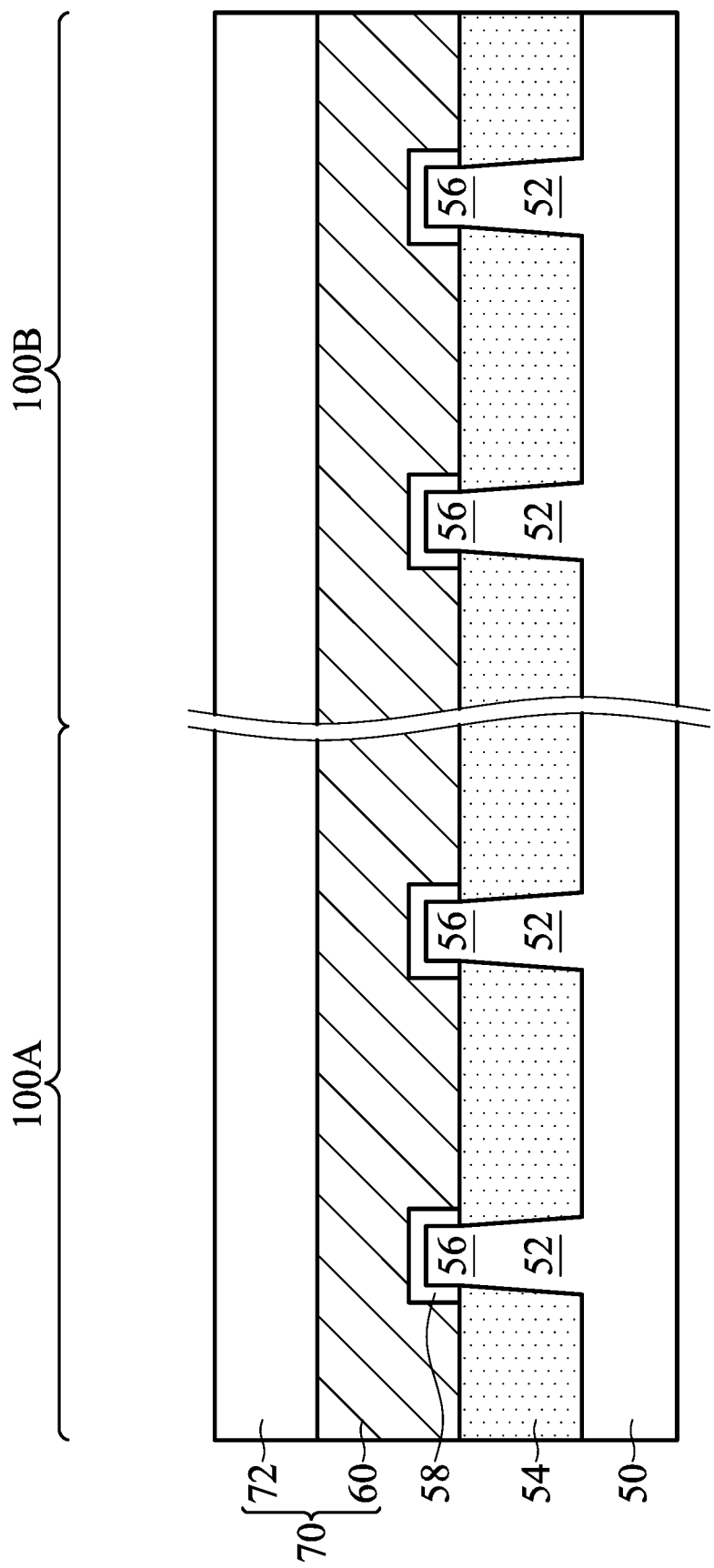

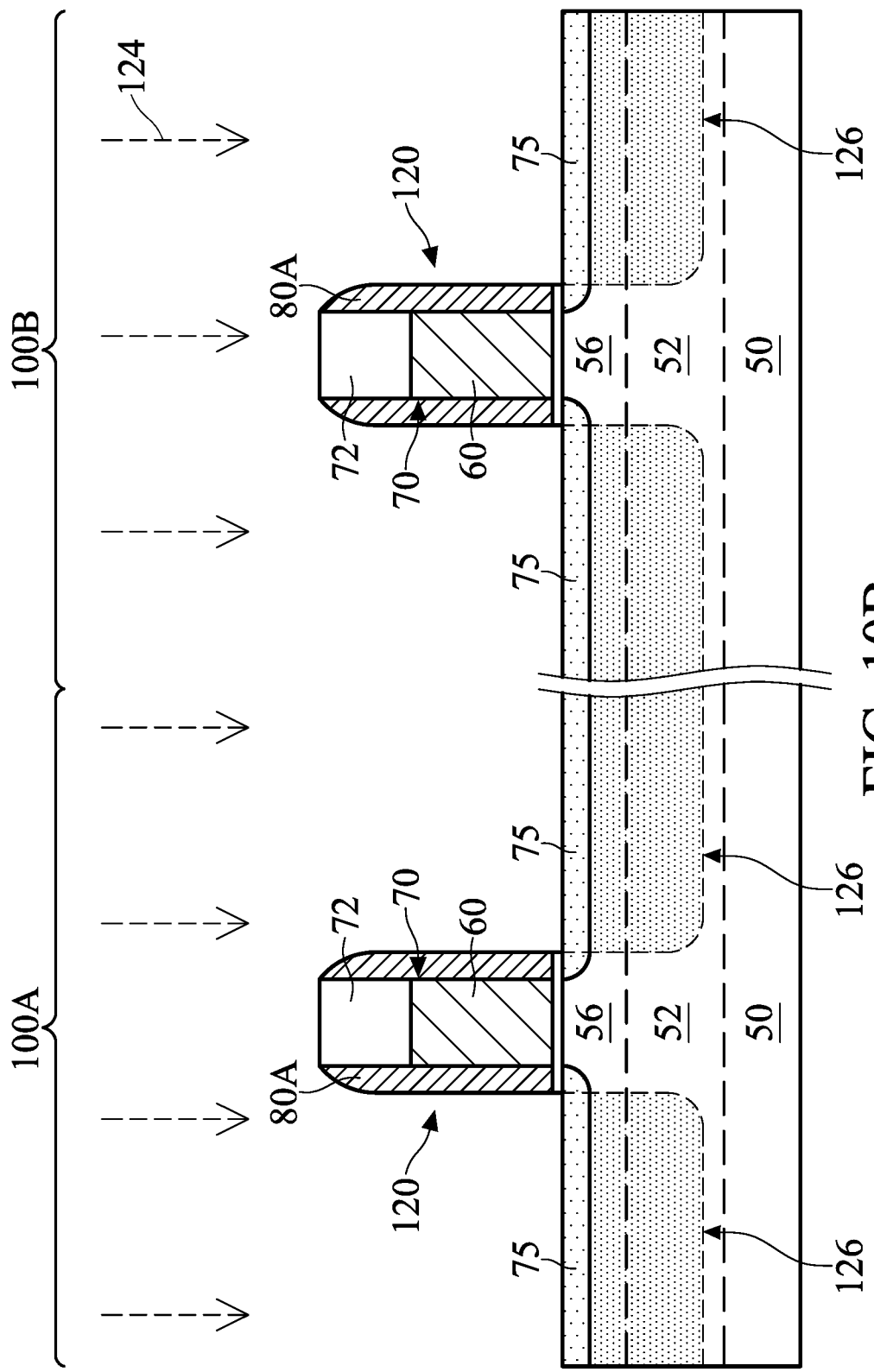

11,264,505 B2

FINFET DEVICE AND METHOD OF FORMING SAME

PRIORITY

This application is a continuation of U.S. patent application Ser. No. 16/122,793, filed on Sep. 5, 2018, which claims the benefit of U.S. Provisional Patent Application No. 62/566,035, filed on Sep. 29, 2017, and entitled "FinFET Device and Method of Forming Same," which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7C are cross-sectional views of intermediate stages in the manufacture of a FinFET device in accordance with some embodiments.

FIGS. 10A-10C are cross-sectional views of intermediate stages in the manufacture of a FinFET device in accordance with some embodiments.

DETAILED DESCRIPTION

Figure 1:
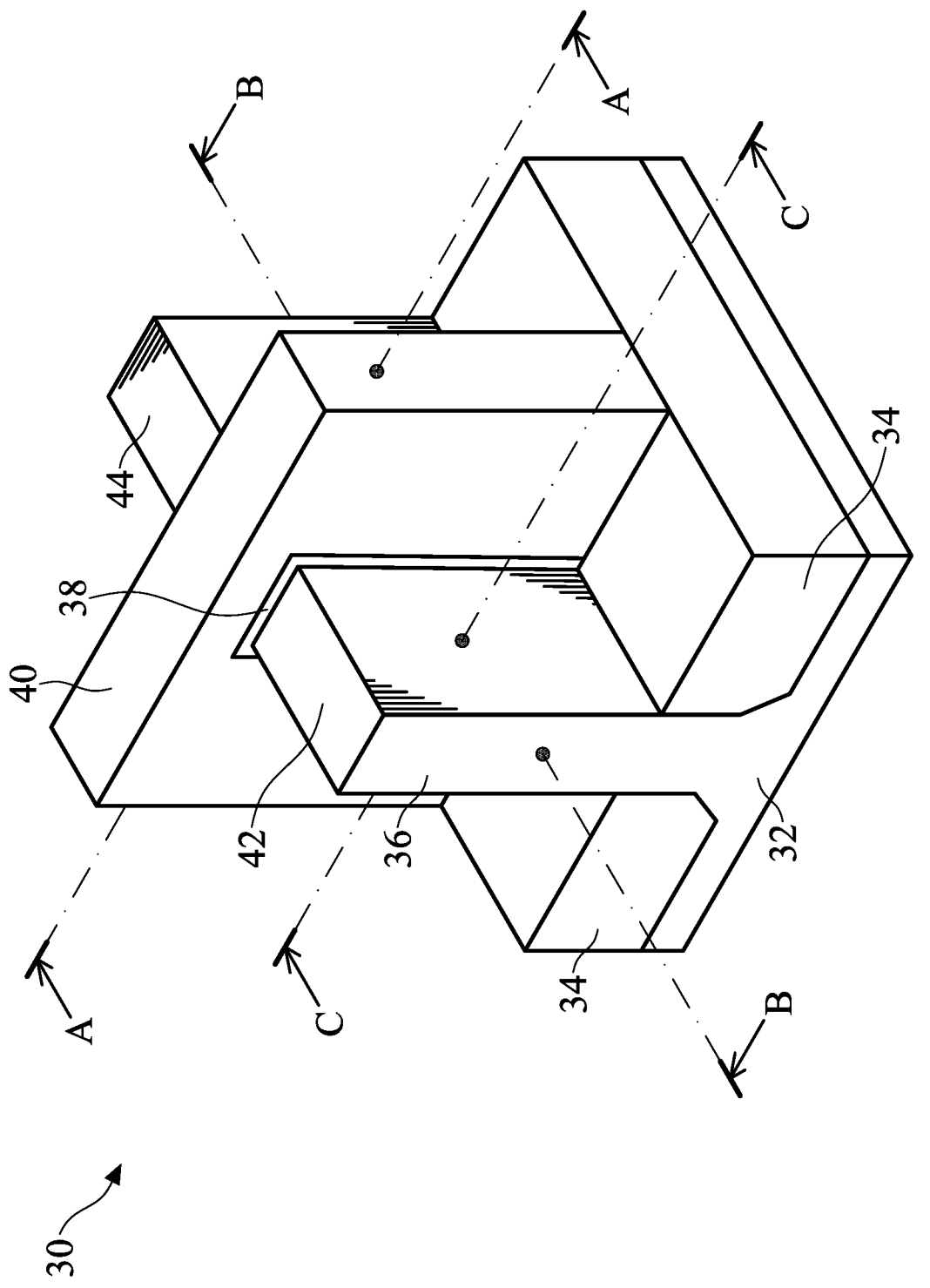
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for controlling the shape of a channel region of a FinFET device, such that the top of the channel region is reduced in size more than the middle of the channel region is reduced in size or more than a height of the channel region is increased. By controlling the shape of the channel region of a FinFET in this manner, the performance of the FinFET device may be improved. Various embodiments presented herein are discussed in the context of FinFETs formed using a gate-last process. In other embodiments, a gate-first process may be used. The fins of a FinFET device may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers may be formed alongside the patterned sacrificial layer using a self-aligned process. The sacrificial layer is then removed, and the remaining spacers, or mandrels, may then be used to pattern the fins. Some embodiments contemplate aspects used in planar devices, such as planar FETs. Some embodiments may be used in a device such as a ring oscillator, or may be used in other types of devices. Some embodiments may also be used in semiconductor devices other than FETs.

FIG. 1 illustrates an example of a fin field-effect transistor (FinFET) 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in subsequent figures. Cross-section A-A is across a channel, gate dielectric 38, and gate electrode 40 of the FinFET 30. Cross-section C-C is in a plane that is parallel to cross-section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

Figure 10A:
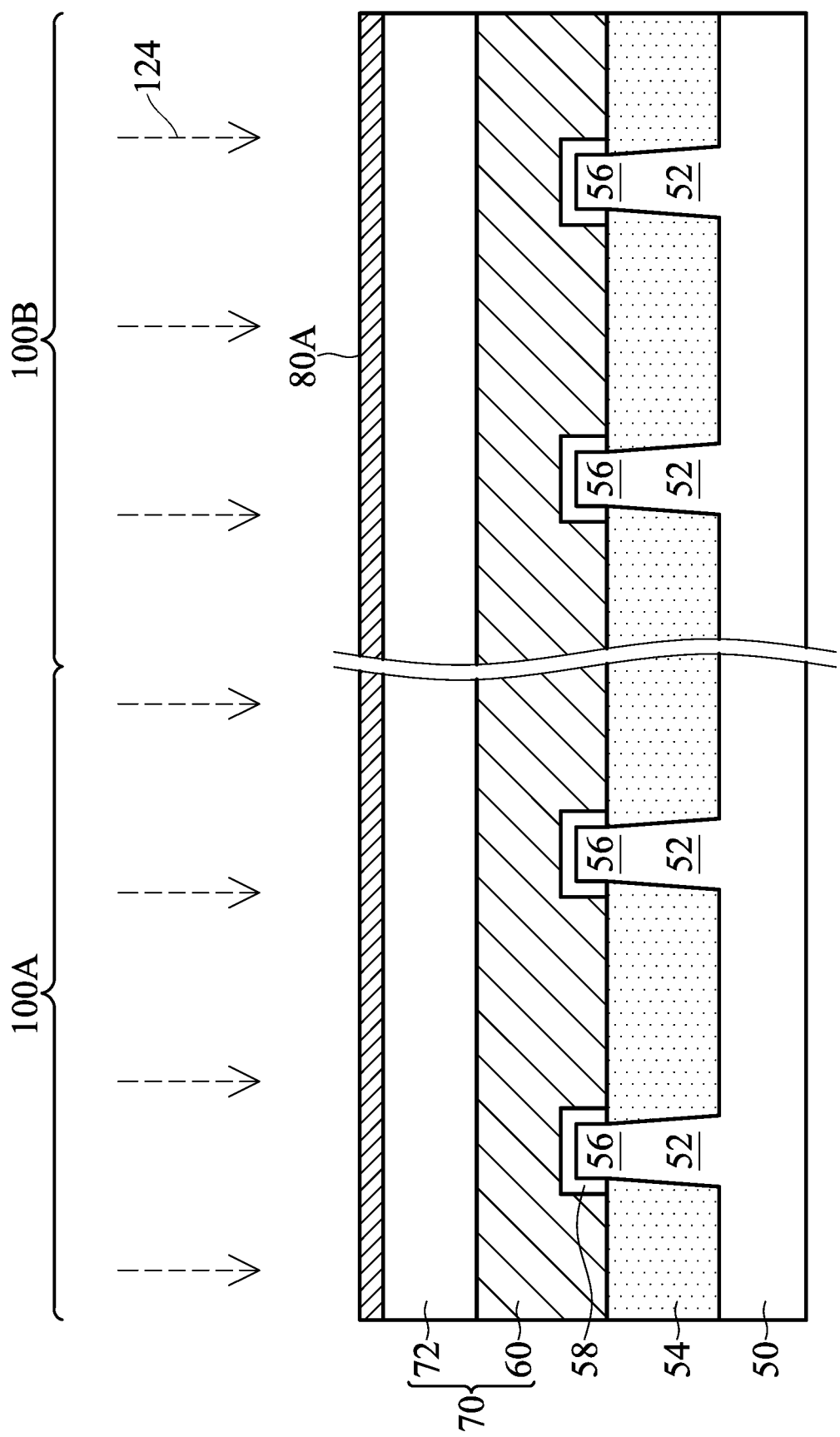
Figure 10C:
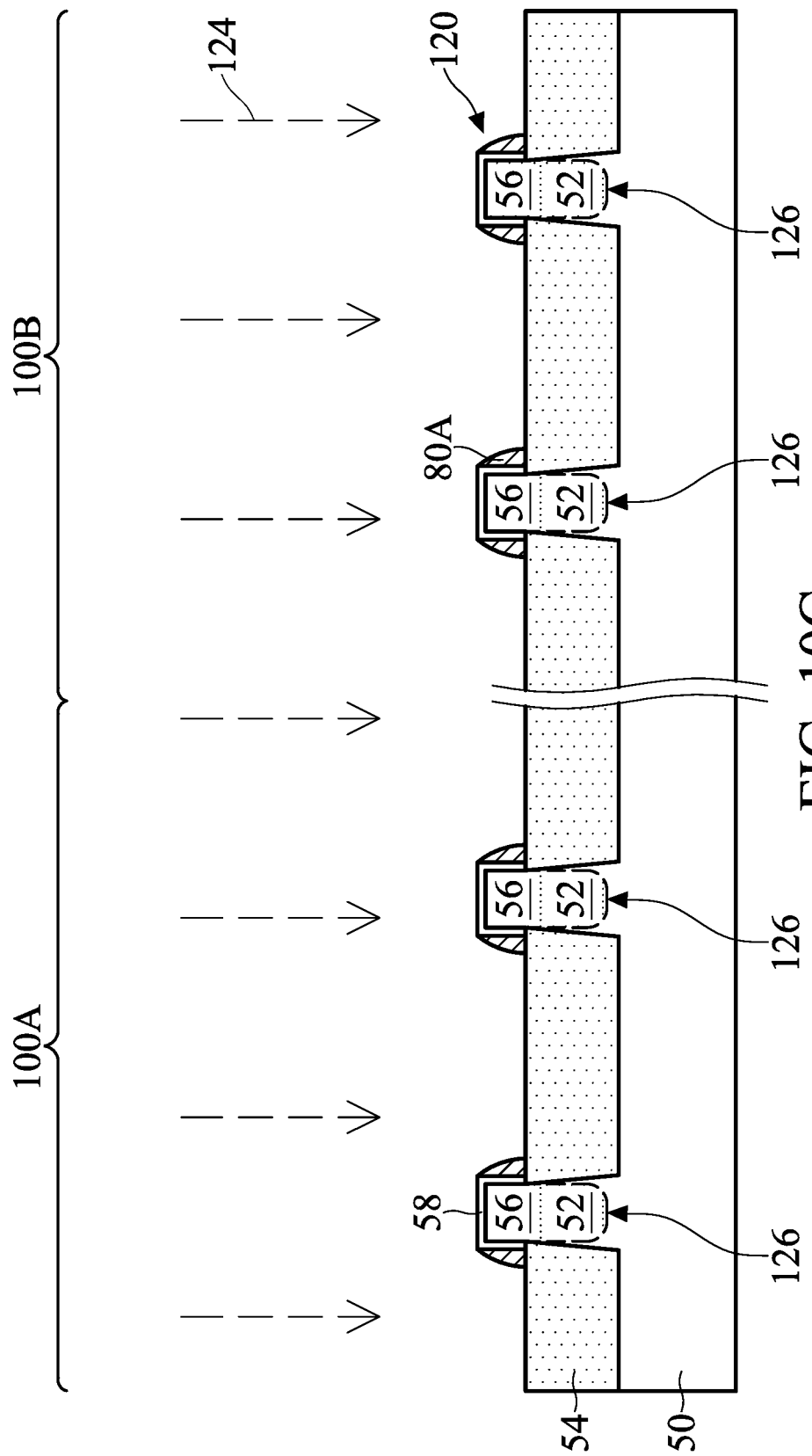
Figure 11:
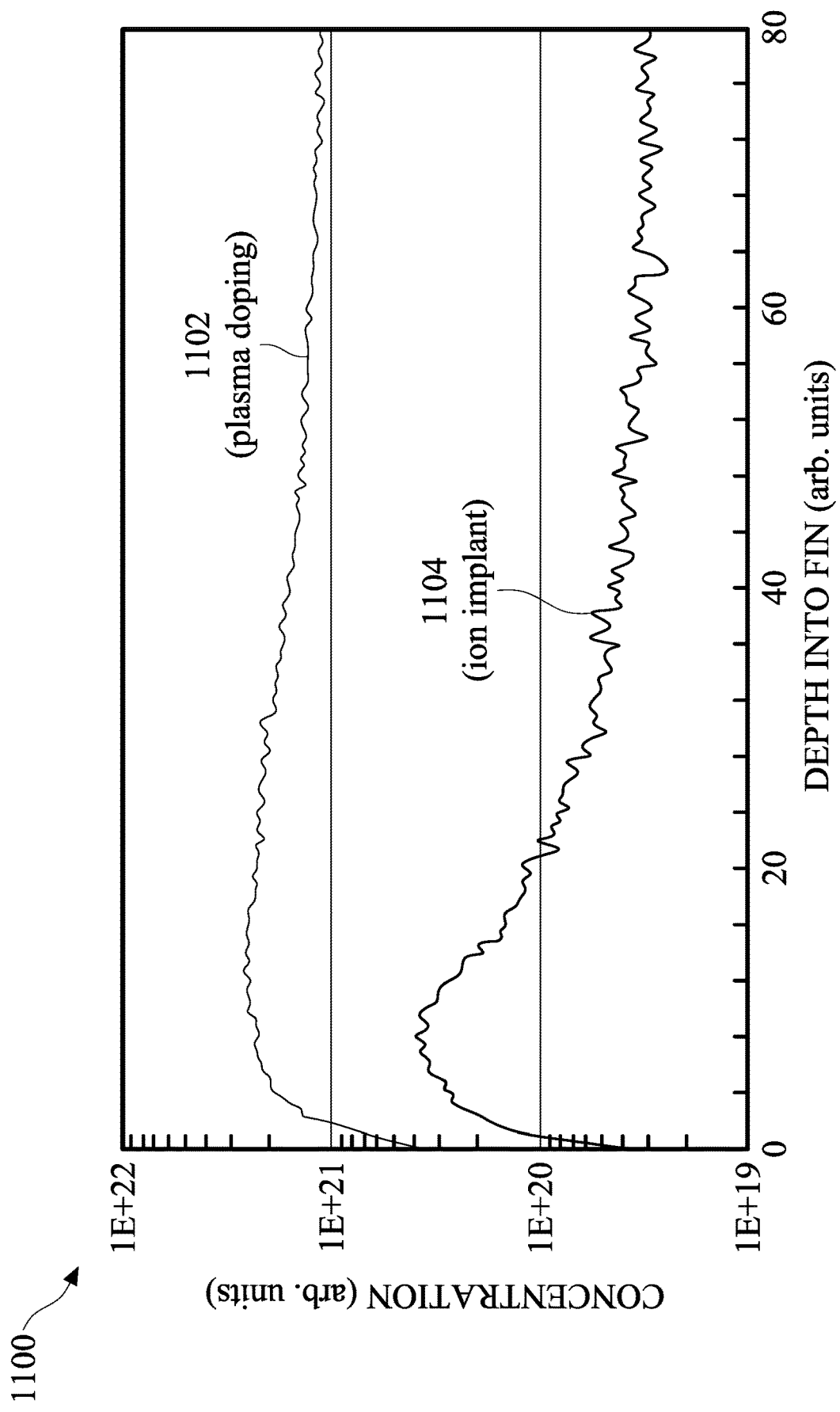
FIG. 11 illustrates experimental results reflecting the relationship between doping profile and implantation technique in accordance with some embodiments.

FIGS. 2 through 22C are cross-sectional views of intermediate stages in the manufacturing of FinFETs in accordance with some embodiment. In FIGS. 6A through 10A-C and FIGS. 12A-C through 22A-C, figures ending with an "A" designation are illustrated along the reference cross-section A-A illustrated in FIG. 1, except for multiple FinFETs and multiple fins per FinFET. Figures ending with a "B" designation are illustrated along the reference cross-section B-B illustrated in FIG. 1. Figures ending with a "C" designation are illustrated along the cross-section C-C illustrated in FIG. 1. FIGS. 2-5 are illustrated along the reference cross-section A-A illustrated in FIG. 1. FIGS. 10B and 11 are illustrated along the reference cross-section B-B illustrated in FIG. 1. FIG. 10C is illustrated along the reference cross-section C-C illustrated in FIG. 1.

Figure 2:
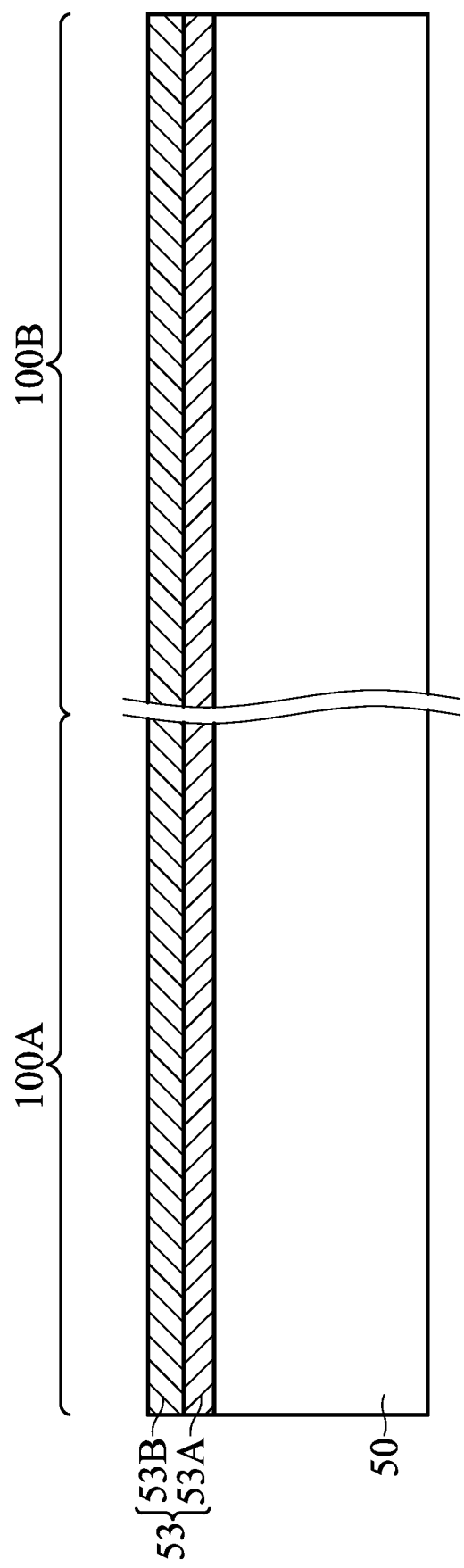
FIG. 2 is a cross-sectional view of an intermediate stage in the manufacture of a FinFET device in accordance with some embodiments.

FIG. 2 illustrates a substrate 50. FIG. 2 is illustrated along the reference cross-section A-A illustrated in FIG. 1. The substrate 50 may be a semiconductor substrate, such as a bulk semiconductor, a semiconductor-on-insulator (SOI) substrate, or the like, which may be doped (e.g., with a P-type or an N-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 50 may include a first region 100A and a second region 100B. The first region 100A can be for forming N-type devices, such as NMOS transistors, such as N-type FinFETs. The second region 100B can be for forming P-type devices, such as PMOS transistors, such as P-type FinFETs. Accordingly, the first region 100A may be also referred to as an NMOS region 100A, and the second region 100B may be also referred to as a PMOS region 100B. In some embodiments, the first region 100A may be physically separated from the second region 100B. The first region 100A may be separated from the second region 100B by any number of features.

FIG. 2 further illustrates the formation of a mask 53 over the substrate 50. In some embodiments, the mask 53 may be used in a subsequent etching step to pattern the substrate 50 (See FIG. 3). As shown in FIG. 2, the mask 53 may include a first mask layer 53A and a second mask layer 53B. The first mask layer 53A may be a hard mask layer, may include silicon nitride, silicon oxynitride, silicon carbide, silicon carbonitride, a combination thereof, or the like, and may be formed using any suitable process, such as atomic layer deposition (ALD), physical vapor deposition (PVD), chemical vapor deposition (CVD), a combination thereof, or the like. The first mask layer 53A may also include multiple layers, and the multiple layers may be different materials. For example, the first mask layer 53A may include a layer of silicon nitride over a layer of silicon oxide, though other materials and combinations of materials may also be used. The second mask layer 53B may include photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may include three or more mask layers.

Figure 3:
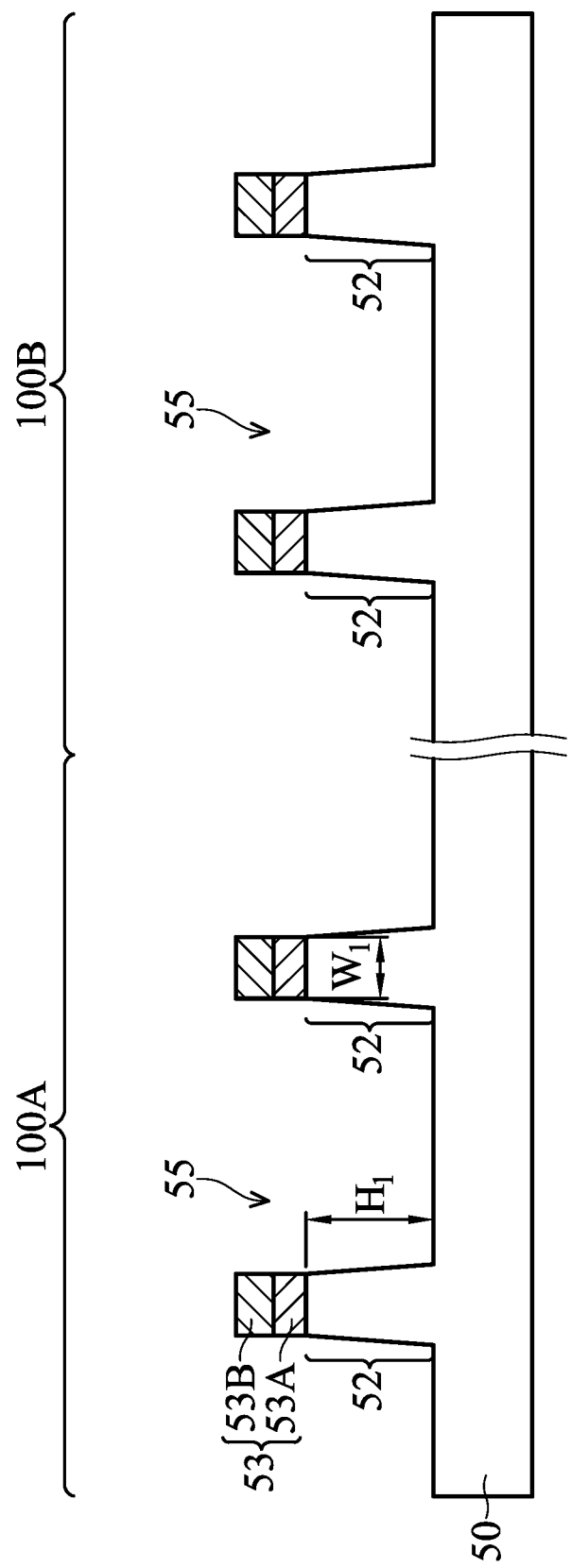
FIG. 3 is a cross-sectional view of an intermediate stage in the manufacture of a FinFET device in accordance with some embodiments.

FIG. 3 illustrates the formation of semiconductor strips 52 in the substrate 50. First, mask 53 may be patterned, where openings in first mask layer 53A and second mask layer 53B expose areas 55 of the substrate 50 where Shallow Trench Isolation (STI) regions 54 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), the like, or a combination thereof. The etch process may be anisotropic. In some embodiments, the semiconductor strips 52 may have a height $H_1$ between about 100 nm and about 300 nm, and may have a width $W_1$ between about 10 nm and about 40 nm.

Figure 4:
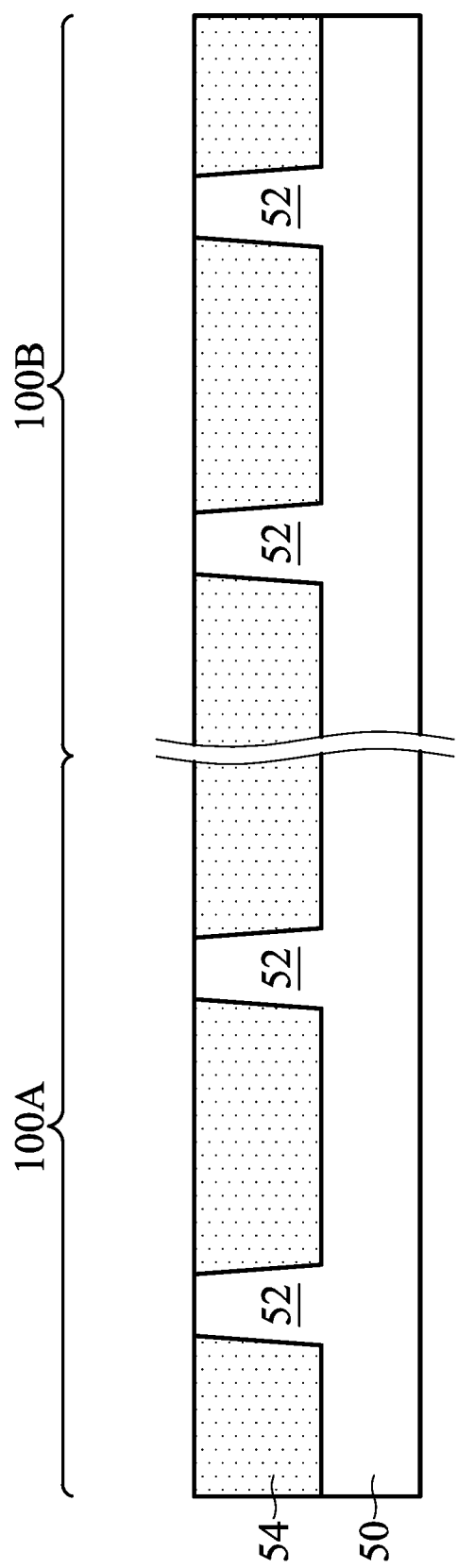
FIG. 4 is a cross-sectional view of an intermediate stage in the manufacture of a FinFET device in accordance with some embodiments.

FIG. 4 illustrates the formation of an insulation material in the trenches 55 (see FIG. 3) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a conformal liner (not illustrated) formed on sidewalls and a bottom surface of the trenches 55 (see FIG. 3) prior to the filling of the trenches 55 with an insulation material of the isolation regions 54. In some embodiments, the liner may include a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. For example, after the insulation material of the isolation regions 54 are deposited, an annealing process may be performed on the insulation material of the isolation regions 54.

Referring further to FIG. 4, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments, the CMP may also remove the mask 53. In other embodiments, the mask 53 may be removed using a wet etching process separate from the CMP.

Figure 5:
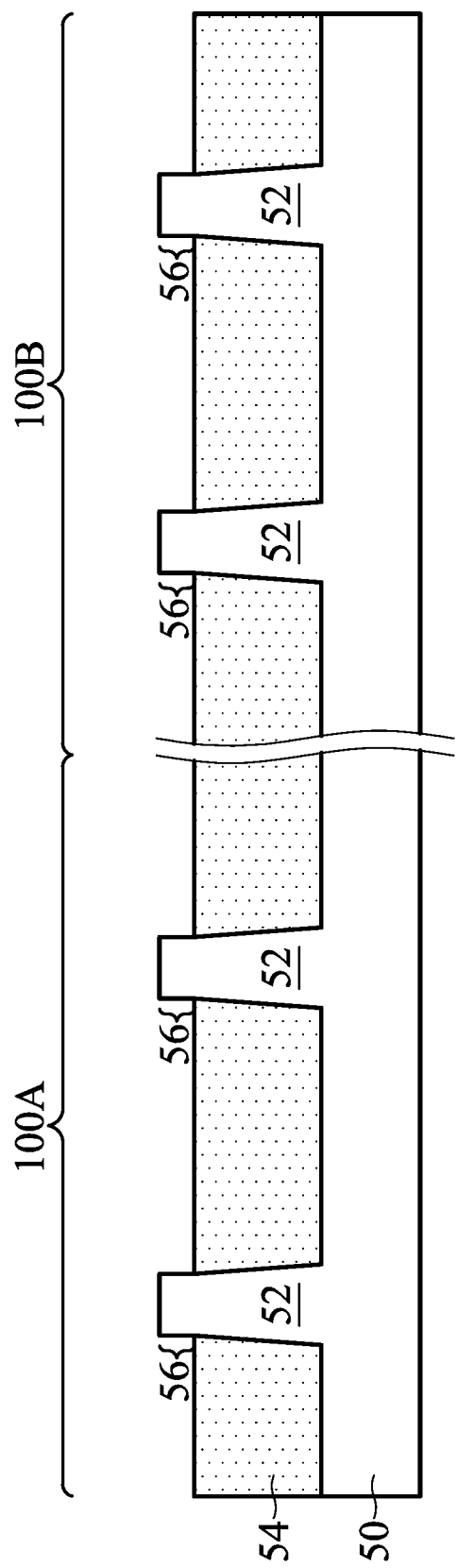
FIG. 5 is a cross-sectional view of an intermediate stage in the manufacture of a FinFET device in accordance with some embodiments.

FIG. 5 illustrates the recessing of the isolation regions 54 to form fins 56. The isolation regions 54 are recessed such that fins 56 in the first region 100A and in the second region 100B protrude from between neighboring isolation regions 54. In some embodiments, the semiconductor strips 52 may be considered to be part of the fins 56. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate process. The isolation regions 54 may be recessed using an acceptable etching process, such as one that is selective to the material of the isolation regions 54. For example, a STI oxide removal using a CERTAS® etch, an Applied Materials SICONI or R2 tool, or dilute hydrofluoric (dHF) acid may be used.

A person having ordinary skill in the art will readily understand that the process described with respect to FIGS. 2 through 5 is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 4 can be recessed, and a material different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. Still further, it may be advantageous to epitaxially grow a material in the NMOS region 100A different from the material in the PMOS region 100B. In various embodiments, the fins 56 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
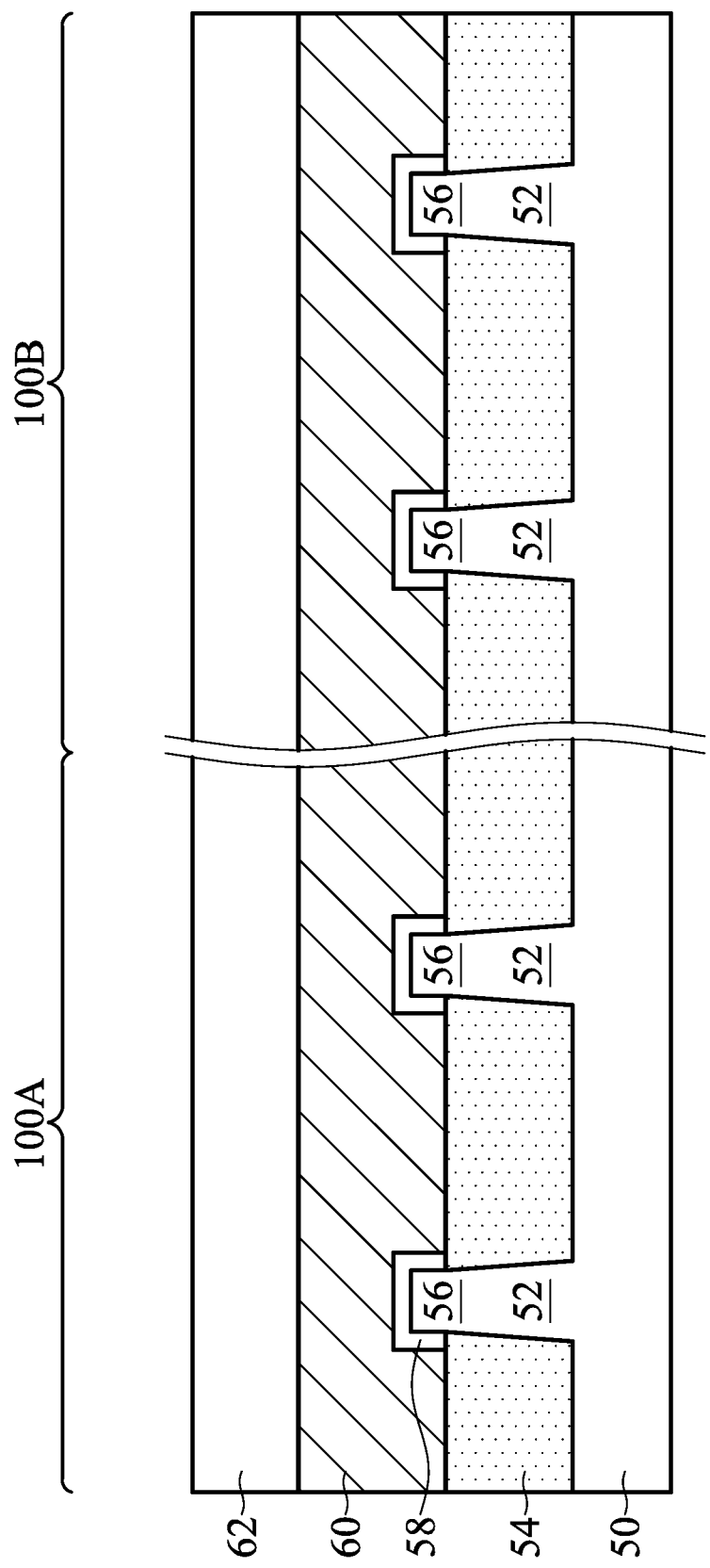
FIGS. 6A-6B are cross-sectional views of intermediate stages in the manufacture of a FinFET device in accordance with some embodiments.
Figure 6B:
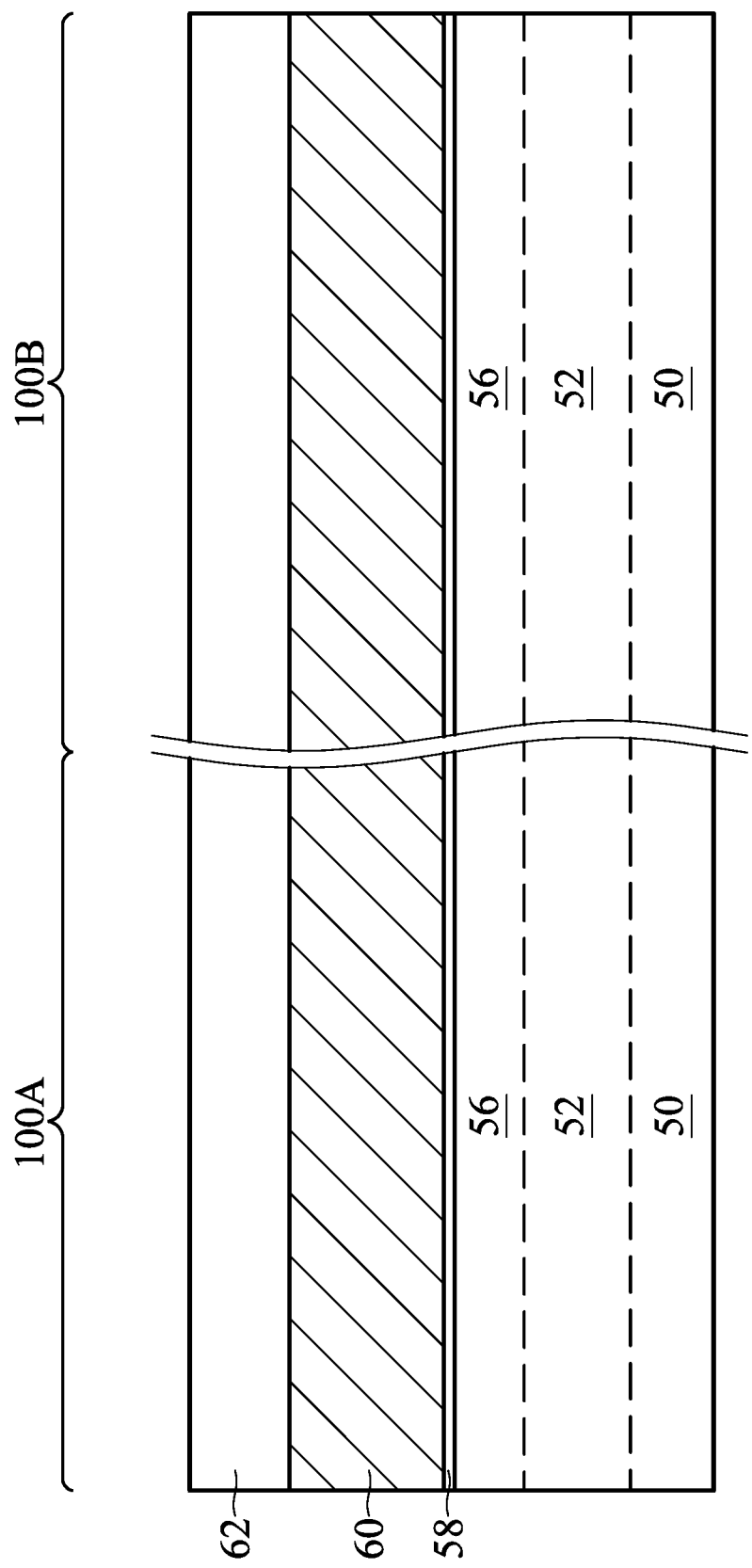

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. A dummy gate layer 60 is formed over the dummy dielectric layer 58, and a mask 62 is formed over the dummy gate layer 60. In some embodiments, the dummy gate layer 60 may be deposited over the dummy dielectric layer 58 and then planarized using, for example, a CMP process. The mask 62 may be deposited over the dummy gate layer 60. The dummy gate layer 60 may be made of, for example, polysilicon, although other materials that have a high etching selectivity with respect to the material of the isolation regions 54 may also be used. The mask 62 may include one or more layers of, for example, silicon nitride, silicon oxynitride, silicon carbide, silicon carbonitride, the like, or a combination thereof.

Referring further to FIGS. 6A and 6B, in the illustrated embodiment, a single dummy dielectric layer 58, a single dummy gate layer 60, and a single mask 62 are formed across the first region 100A and the second region 100B. In other embodiments, separate dummy dielectric layers, separate dummy gate layers, and separate masks may be formed in the first region 100A and the second region 100B. In some embodiments, the dummy dielectric layer 58 may have a thickness between about 0.5 nm and about 3.0 nm, and the dummy gate layer 60 may have a thickness between about 50 nm and about 100 nm.

Figure 7B:
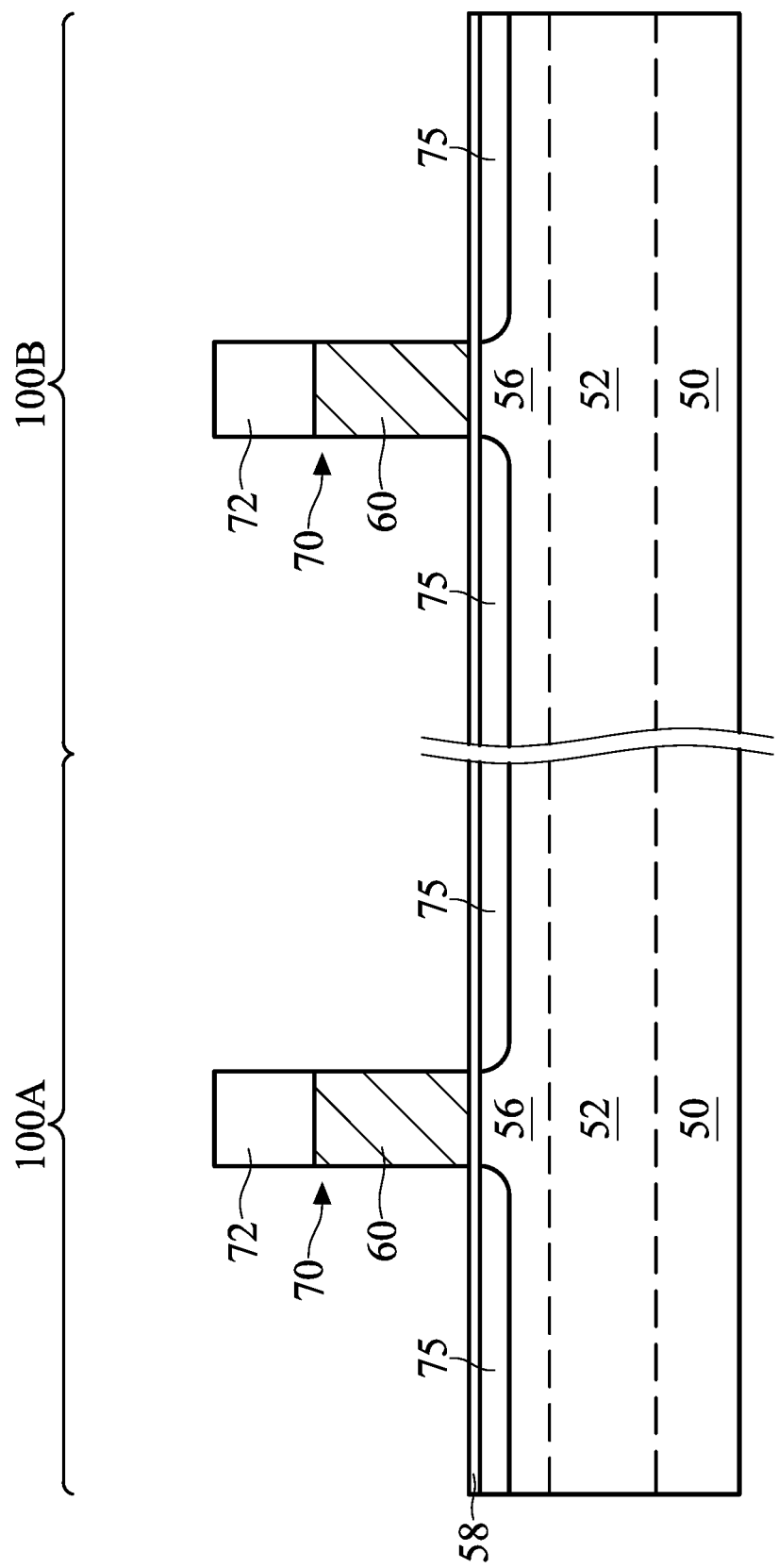
Figure 7C:
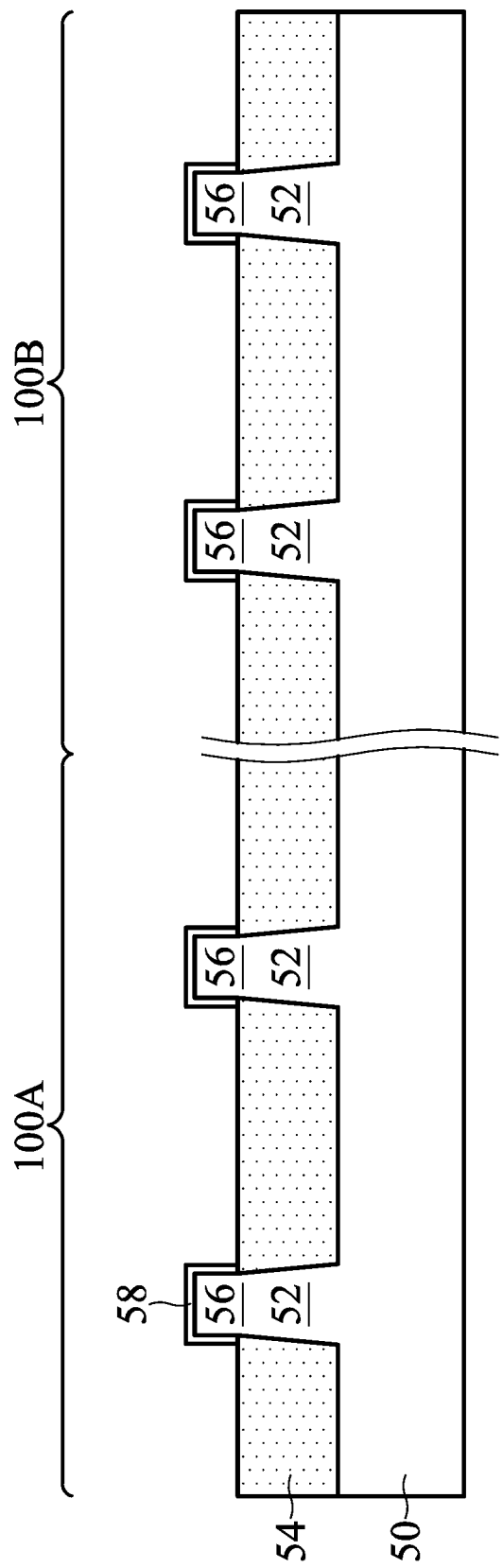

In FIGS. 7A, 7B, and 7C, the mask 62 (see FIGS. 6A and 6B) may be patterned using acceptable photolithography and etching techniques to form a mask 72 in the first region 100A and in the second region 100B. The mask 72 may be a hardmask, and the pattern of the mask 72 may be different between the first region 100A and the second region 100B The pattern of the mask 72 may be transferred to the dummy gate layer 60 by an acceptable etching technique to form dummy gate stack 70 in the first region 100A and in the second region 100B. The dummy gate stack 70 includes the dummy gate layer 60 and the mask 72. In some embodiments, the dummy gate layer 60 and the mask 72 are formed in separate processes in the first region 100A and the second region 100B, and may be formed of different materials in the first region 100A and the second region 100B. Optionally, the pattern of the mask 72 may similarly be transferred to dummy dielectric layer 58. The pattern of the dummy gate stack 70 covers respective channel regions of the fins 56 while exposing source/drain regions of the fins 56. The dummy gate stack 70 may also have a lengthwise direction substantially perpendicular to the lengthwise direction of respective fins 56. A size of the dummy gate stack 70 or a pitch between dummy gate stacks 70 may depend on a region of a die in which the dummy gates are formed. In some embodiments, dummy gate stacks 70 may have a larger size or a larger pitch when located in an input/output region of a die (e.g., where input/output circuitry is disposed) than when located in a logic region of a die (e.g., where logic circuitry is disposed). In some embodiments, the dummy gate stacks 70 may have a width between about 10 nm and about 40 nm.

Figure 8A:
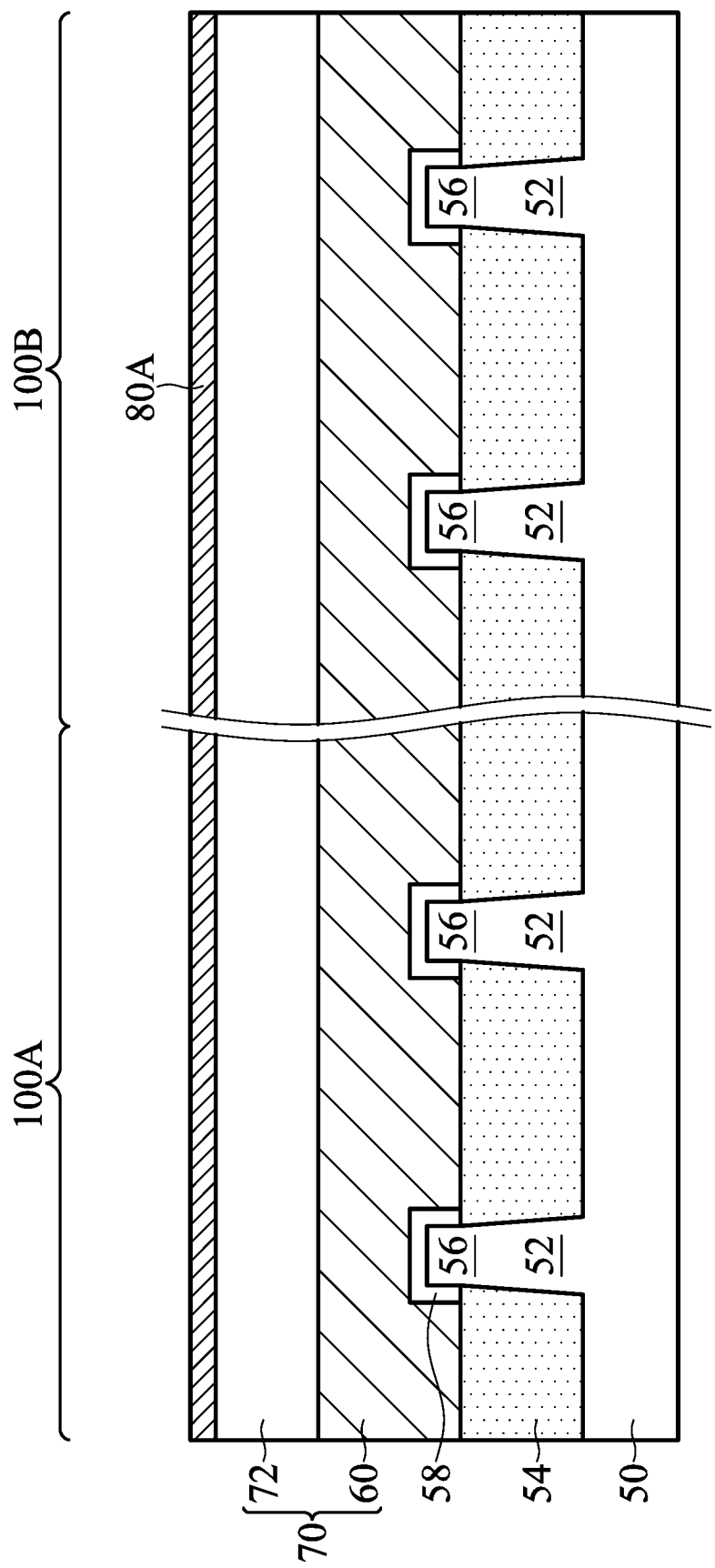
FIGS. 8A-8C are cross-sectional views of intermediate stages in the manufacture of a FinFET device in accordance with some embodiments.
Figure 8B:
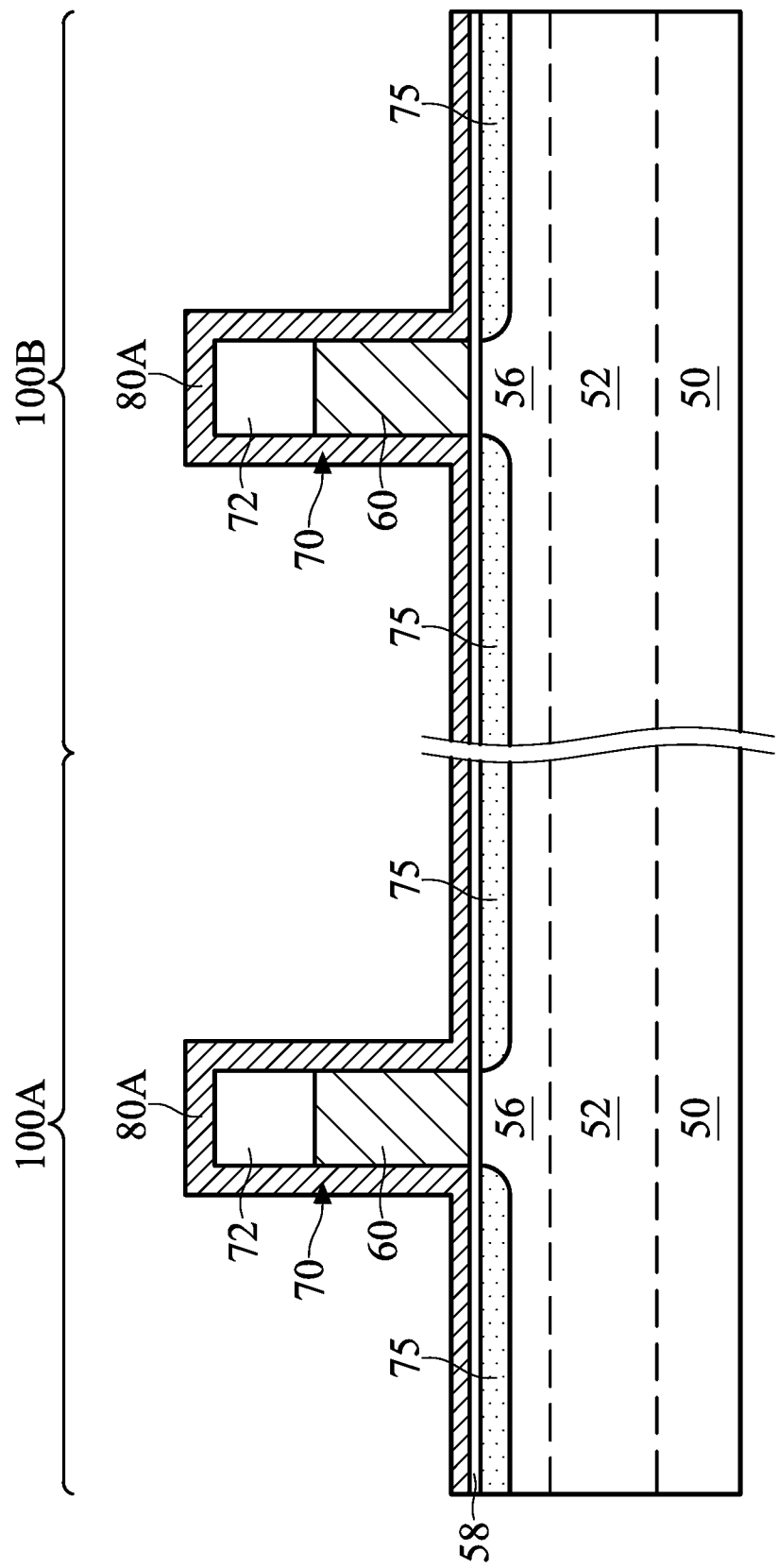
Figure 8C:
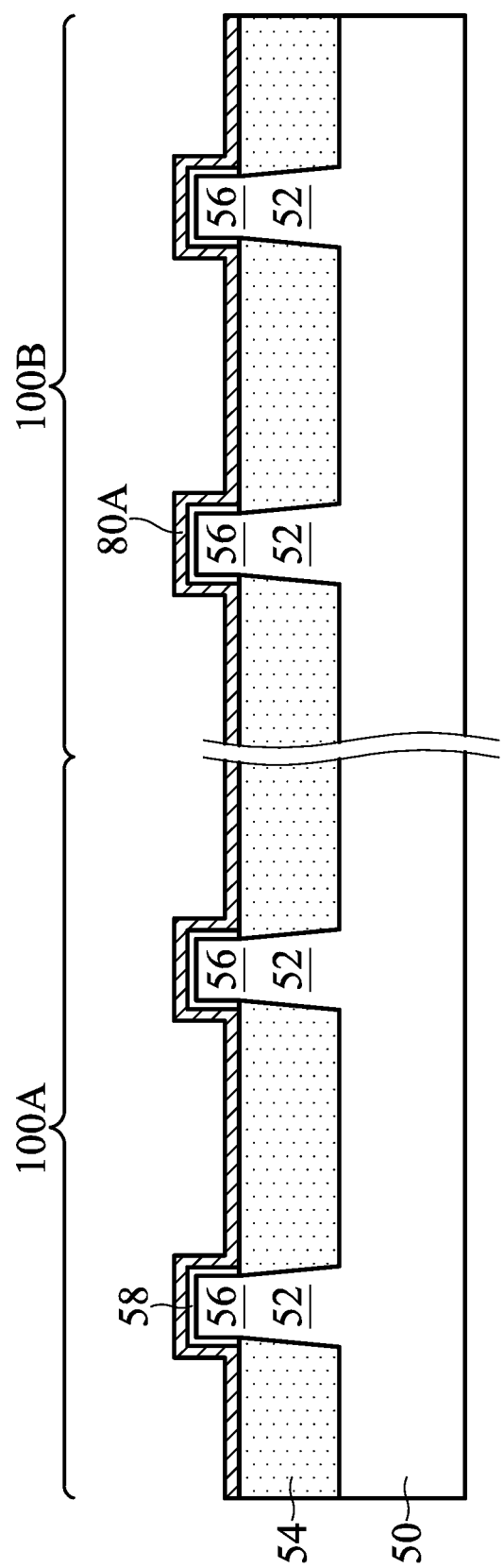

In FIGS. 8A, 8B, and 8C, a first spacer layer 80A is formed over the first region 100A and the second region 100B. Any suitable methods of forming the first spacer layer 80A may be used. In some embodiments, a deposition (such as CVD, ALD, or the like) may be used form the first spacer layer 80A. In some embodiments, the first spacer layer 80A may include one or more layers of, for example, an oxide material, silicon nitride (SiN), silicon oxynitride (SiON), silicon carbonitride (SiCN), silicon oxycarbonitride (SiOCN), a combination thereof, or the like.

Referring further to FIGS. 8A, 8B, and 8C, lightly doped source/drain (LDD) regions 75 may be formed in the substrate 50 in the first region 100A and the second region 100B. Similar to the implantation process discussed above with reference to FIGS. 7A, 7B and 7C, a mask (not shown), such as a photoresist, may be formed over the first region 100A, e.g., the NMOS region, while exposing the second region 100B, e.g., the PMOS region, and P-type impurities may be implanted into the exposed fins 56 to create LDD regions 75 in the second region 100B. The mask may then be removed. Subsequently, a second mask (not shown), such as a photoresist, may be formed over the second region 100B, while exposing the first region 100A, and N-type impurities may be implanted into the exposed fins 56 to create LDD regions 75 in the first region 100A. The second mask may then be removed. During the implantation of the LDD regions 75, the dummy gate stack 70 may act as a mask to prevent (or at least reduce) dopants from implanting into a channel region of the exposed fins 56. Thus, the LDD regions 75 may be formed substantially in source/drain regions of the exposed fins 56. The N-type impurities may be any of the N-type impurities previously discussed, and the P-type impurities may be any of the P-type impurities previously discussed. The LDD regions 75 and 79 may each have a concentration of impurities from about $10^{15}$ cm$^{-3}$ to about $10^{16}$ cm$^{-3}$. An annealing process may be performed to activate the implanted impurities. In some embodiments, the LDD regions 75 are formed prior to formation of first spacer layer 80A.

Figure 9A:
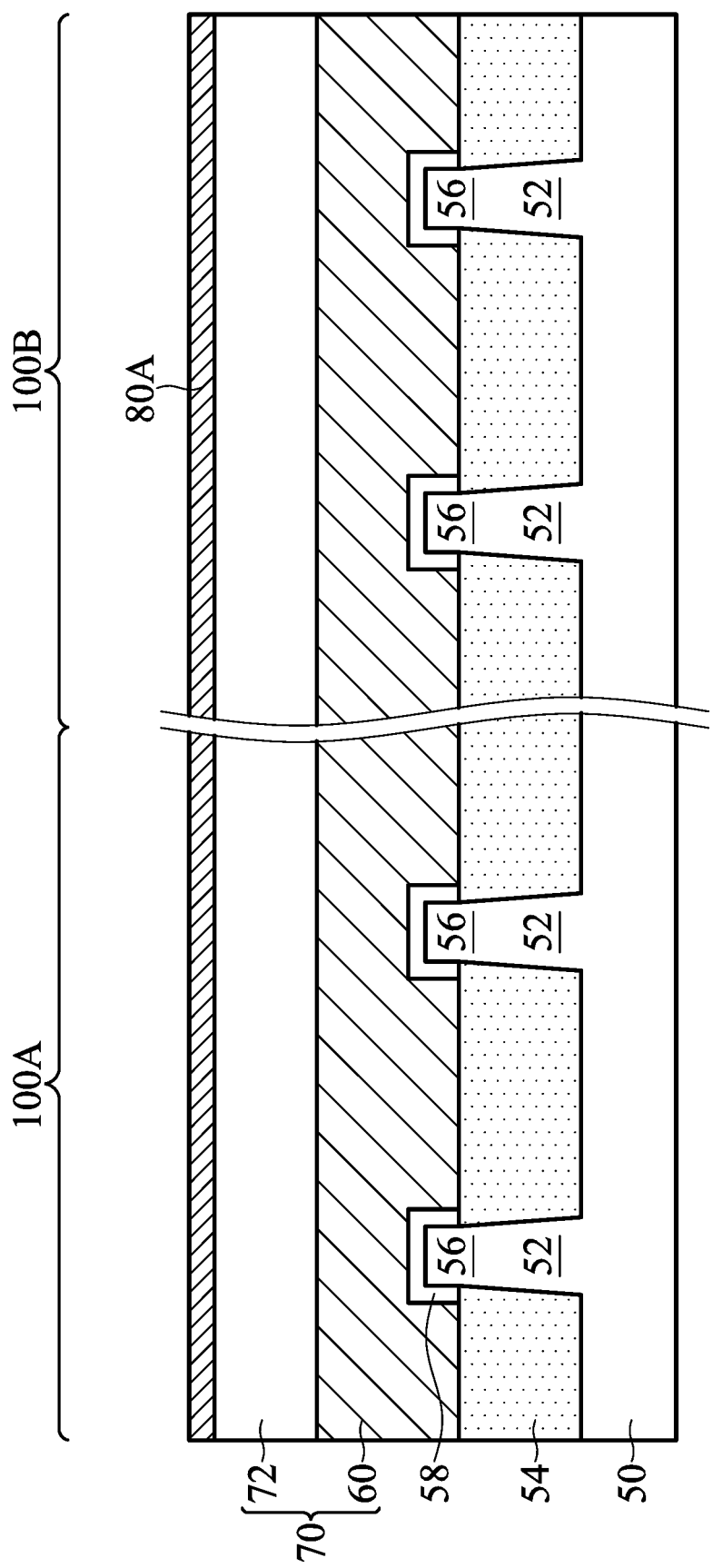
FIGS. 9A-9C are cross-sectional views of intermediate stages in the manufacture of a FinFET device in accordance with some embodiments.
Figure 9B:
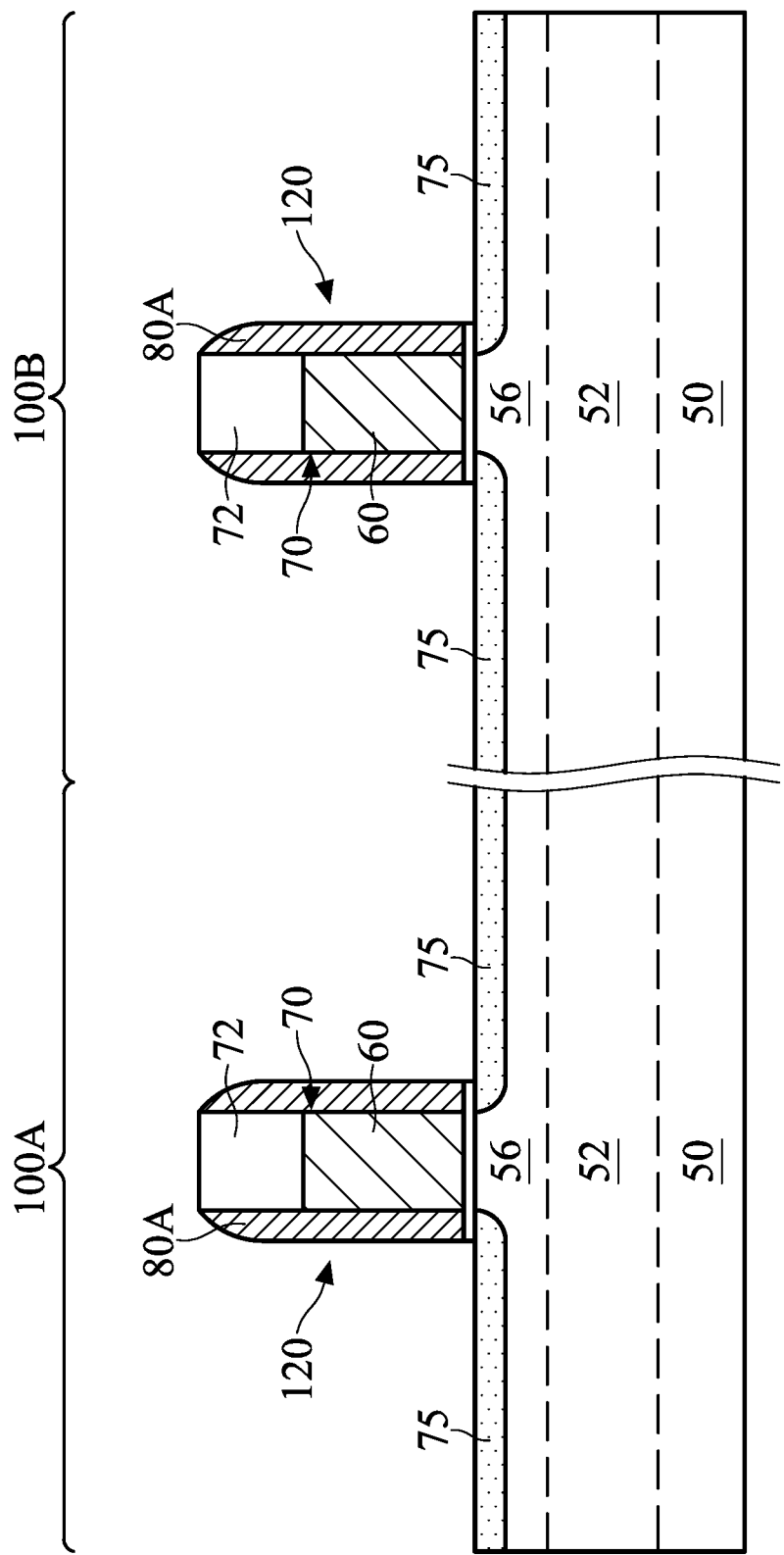
Figure 9C:
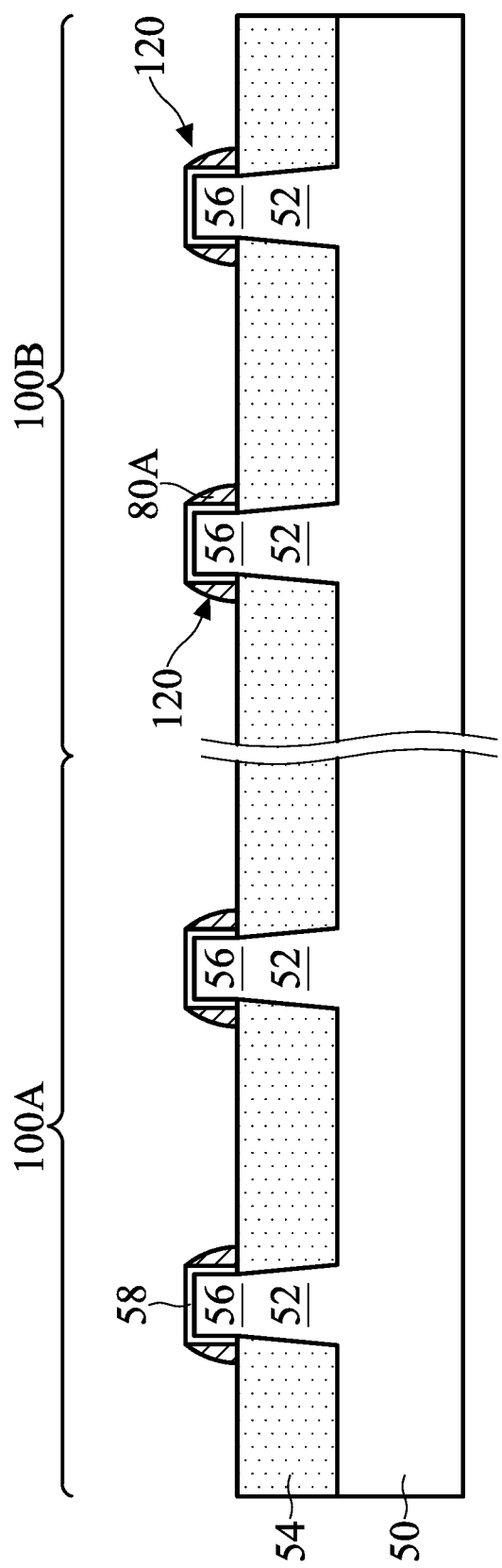

Referring to FIGS. 9A, 9B, and 9C, an etching process is performed on portions of the first spacer layer 80A. The etching process may be a dry etch process, and may be anisotropic. After performing the etching process, lateral portions of the first spacer layer 80A over the LDD regions 75 and over the isolation regions 54 may be removed to expose top surfaces of the fins 56 and the masks 72 for the dummy gate stack 70. Portions of the first spacer layer 80A along sidewalls of the dummy gate stack 70 and the fins 56 may remain and form offset spacers 120. In other embodiments, the first spacer layer 80A may also be removed from the sidewalls of the fins 56. In some embodiments, offset spacers 120 in the first region 100A are formed at the same time as offset spacers 120 in the second region 100B, and in other embodiments, offset spacers 120 in the first region 100A and the second regions 100B are formed in separate processes. In some embodiments, lateral portions of the dummy dielectric layer 58 over the LDD regions 75 and over the isolation regions 54 may also be removed.

Referring to FIGS. 10A-C, a plasma doping process 124 is performed for the first region 100A and the second region 100B. FIG. 10A is illustrated along the reference cross-section A-A illustrated in FIG. 1, FIG. 10B is illustrated along the reference cross-section B-B illustrated in FIG. 1, and FIG. 10C is illustrated along the reference cross-section C-C illustrated in FIG. 1. In some embodiments, the plasma doping process 124 implants one or more dopants into portions of the fins 56 and the semiconductor strips 52, forming doped regions 126. In some embodiments, the plasma doping process 124 also implants the one or more dopants into portions of offset spacers 120, mask 72, dummy dielectric layer 58, or isolation regions 54. In some embodiments, the one or more dopants includes an N-type dopant such as As, P, or other dopants. The plasma doping process 124 may use a gas source that includes a dopant and an inert gas. For example, the dopant may be As, and the inert gas may be Xe, He, Ar, Ne, Kr, the like, or combinations thereof. In some embodiments, doped regions 126 extend from top surfaces of the semiconductor strips 52 or the fins 56 toward the substrate 50. In some embodiments, doped regions 126 extend from top surfaces of the semiconductor strips 52 or the fins 56 to below a top surface of the isolation regions 54. In some embodiments, the doped region 126 may undercut the offset spacers a lateral distance between about 3 nm and about 8 nm, such as about 3.5 nm or about 7 nm.

In some embodiments, the plasma doping process 124 is performed using a gas source having between about 5% by volume and about 20% by volume of As and between about 80% by volume and about 95% by volume of Xe. In some embodiments, the plasma doping process 124 is performed using a gas source of a mixture of $AsH_3$ and $H_2$ having between about 1% by volume and about 50% by volume of $AsH_3$, such as about 30% by volume of $AsH_3$. In some embodiments, the gas source has a flow rate of $AsH_3/H_2$ between about 5 standard cubic centimeter per minute (sccm) and about 80 sccm, and has a flow rate of Xe between about 80 sccm and about 200 sccm. In some embodiments, the applied voltage bias is between about 0.5 kV and about 2.5 kV. A dosage of the dopant may be between about 5E19 atoms/cm$^3$ and about 1E22 atoms/cm$^3$. The gas source may be activated into plasma by any suitable method of generating the plasma, such as transformer coupled plasma generator, inductively coupled plasma systems, magnetically enhanced reactive ion etching, electron cyclotron resonance, a remote plasma generator, or the like.

In some embodiments, an optional anneal process is performed after the plasma doping process 124. In some cases, the anneal process may be used to drive the dopant into the fins 56 or the semiconductor strips 52. The anneal process may be performed in a same chamber as the plasma doping process or in a different chamber. The anneal process may be a thermal anneal such as a spike anneal, a flash anneal, or another type of anneal process as known in the art. In some embodiments, the anneal process is a spike anneal process performed at a temperature between about 950° C. and about 1050° C., such as about 1045° C., for a time interval between about 1 second to about 2 seconds.

The use of a plasma doping process such as plasma doping process 124 can allow for a more uniform doping profile of the doped regions 126 of the fins 56 and the semiconductor strips 52. The more uniform doping of the fins 56 and the semiconductor strips 52 can allow for a more uniform sidewall of a fin recess, described in greater detail below with respect to FIG. 15. In some cases, a plasma doping process can generate a more uniform doping profile than an ion implantation process. For example, the dopant profile from an ion implantation process can depend on the implant angle, which may be limited or restricted due to feature geometry such as pitch size. In some embodiments, the doping profile of the doped region 126 can be controlled by controlling the implantation energy of the plasma doping process 124. FIG. 11 illustrates a graph 1100 showing example results of experiments doping a fin and semiconductor strip similar to a fin 56 and a semiconductor strip 52 described previously. Graph 1100 shows measurements of the concentration of As dopant in a fin versus the distance into the fin measured from the top of the fin. Measurement 1102 shows the concentration of As dopant implanted using a plasma doping process, and measurement 1104 shows the concentration of As dopant implanted using an ion implantation process. As graph 1100 shows, the concentration of (plasma doped) dopant in measurement 1102 decreases more gradually from the peak concentration into the fin than the concentration of (ion implanted) dopant in measurement 1104. Thus, graph 1100 shows how a plasma doping process such as plasma doping process 124 can produce a more uniform dopant concentration into a semiconductor structure.

Figure 12A:
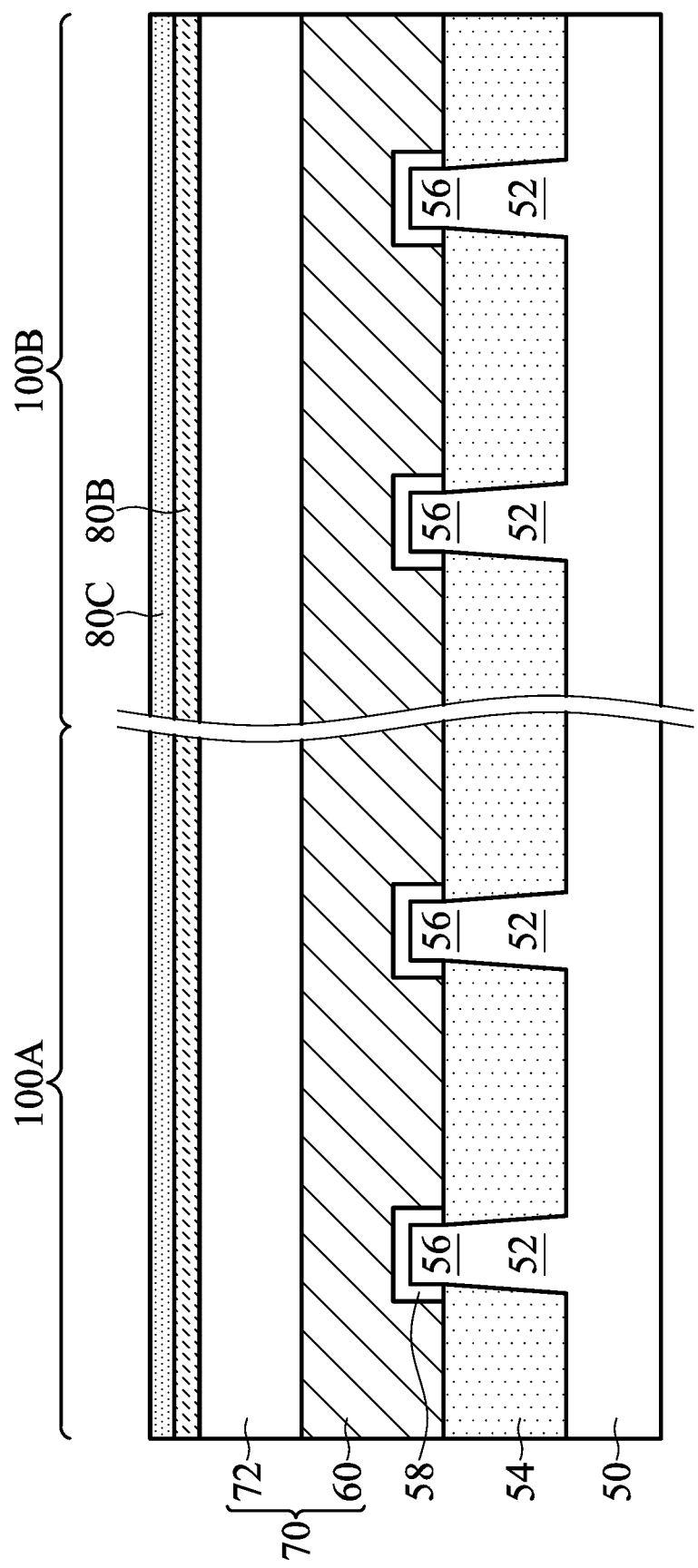
FIGS. 12A-12C are cross-sectional views of intermediate stages in the manufacture of a FinFET device in accordance with some embodiments.
Figure 12B:
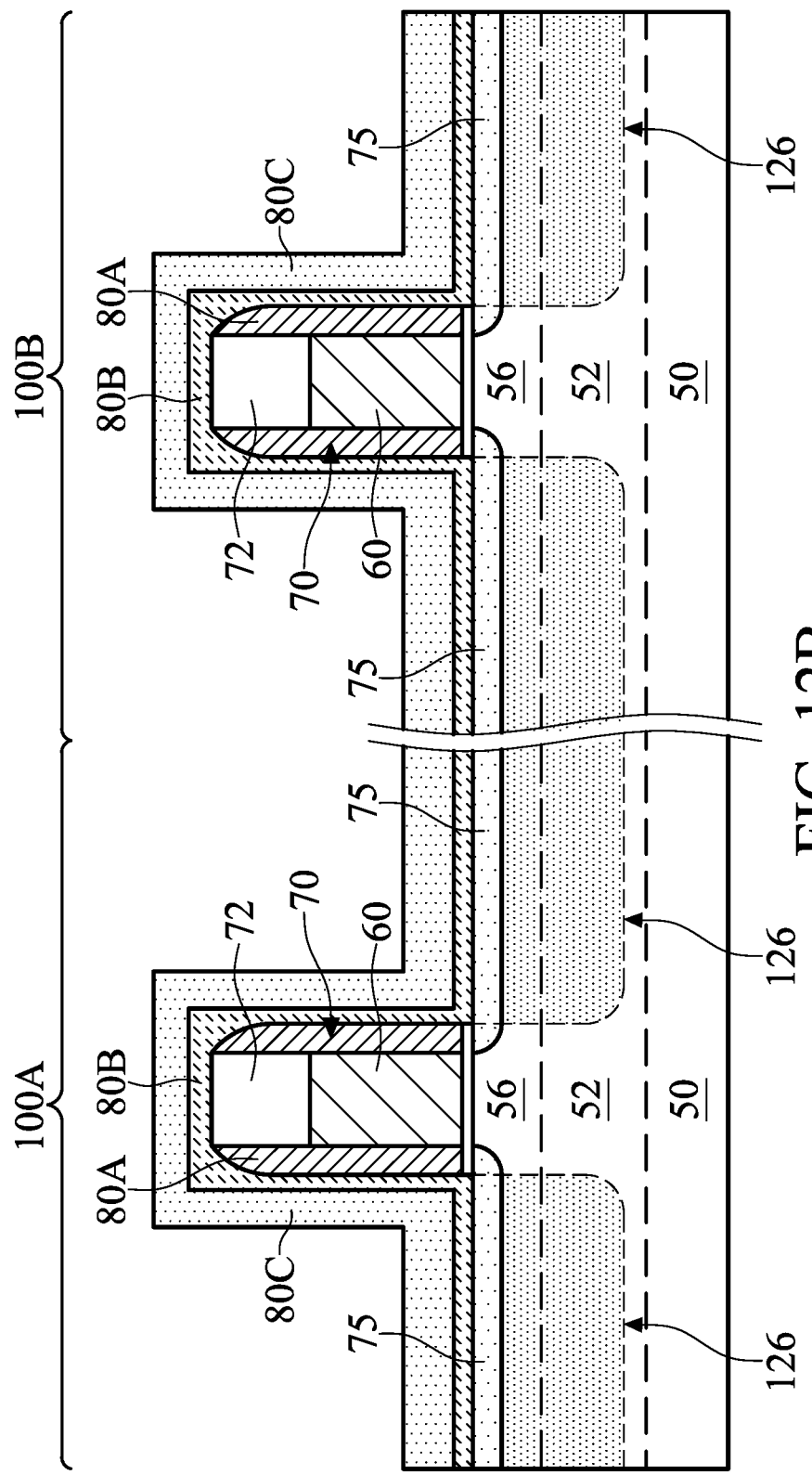
Figure 12C:
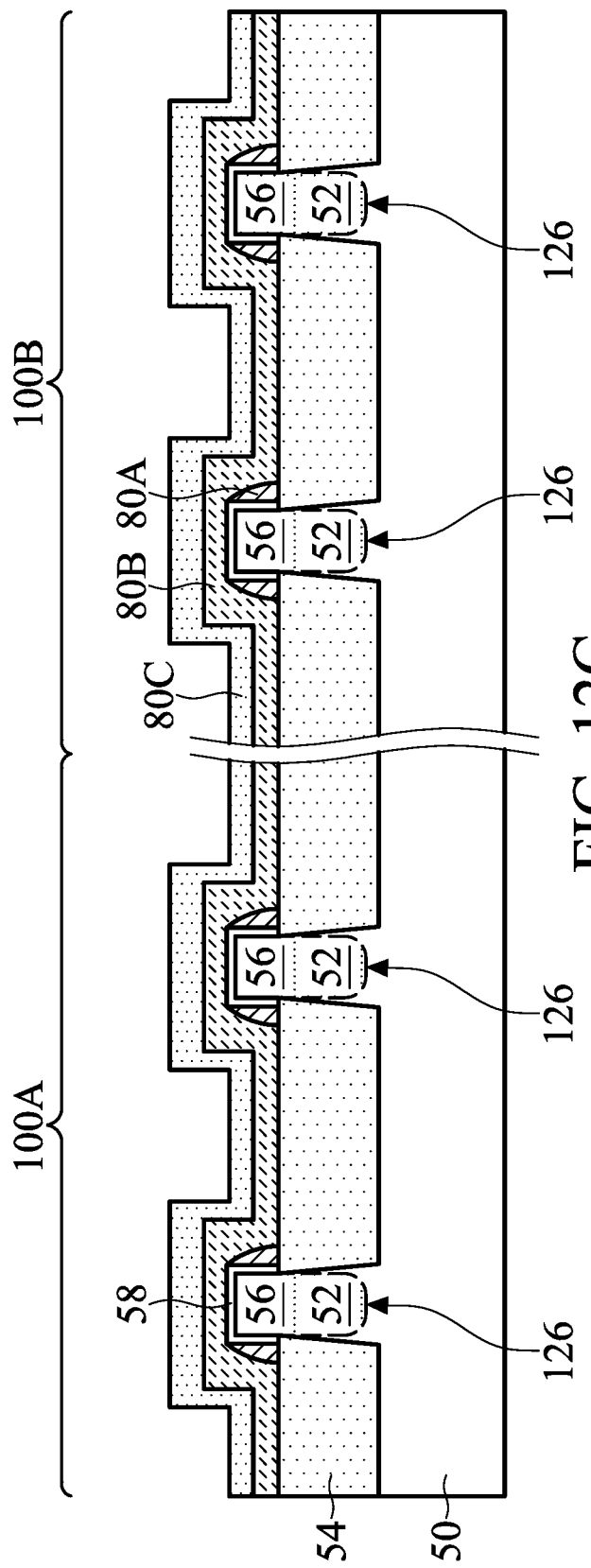

In FIGS. 12A, 12B, and 12C, a second spacer layer 80B and a third spacer layer 80C are formed over the first region 100A and the second region 100B. Any suitable methods of forming the first spacer layer 80A may be used. In some embodiments, a deposition (such as CVD, ALD, or the like) may be used form the second spacer layer 80B or the third spacer layer 80C. In some embodiments, the second spacer layer 80B or the third spacer layer 80C may include one or more layers of, for example, an oxide material, silicon nitride (SiN), silicon oxynitride (SiON), silicon carbonitride (SiCN), silicon oxycarbonitride (SiOCN), a combination thereof, or the like. In some embodiments, one of the second spacer layer 80B or the third spacer layer 80C may be omitted.

Figure 13A:
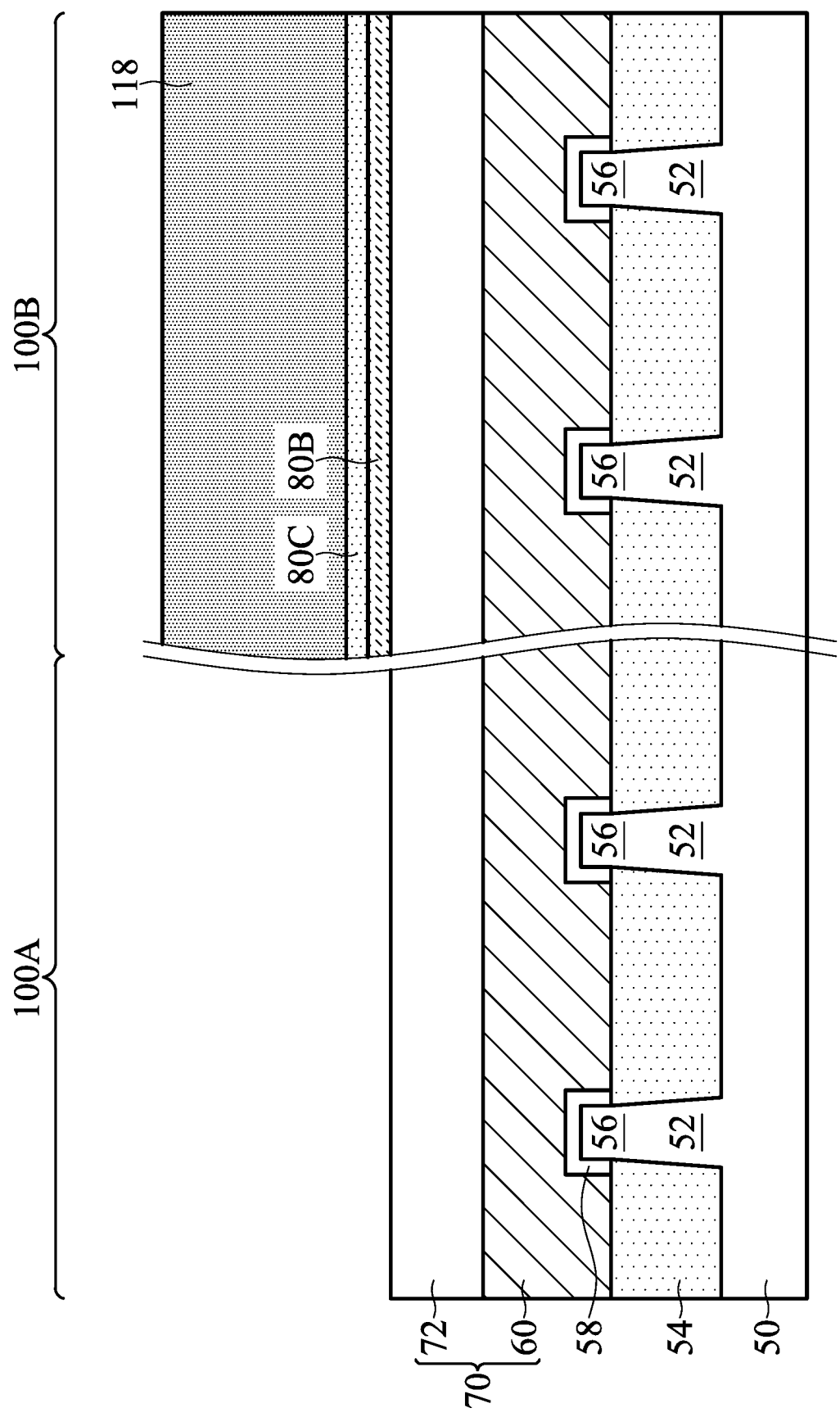
FIGS. 13A-13C are cross-sectional views of intermediate stages in the manufacture of a FinFET device in accordance with some embodiments.
Figure 13B:
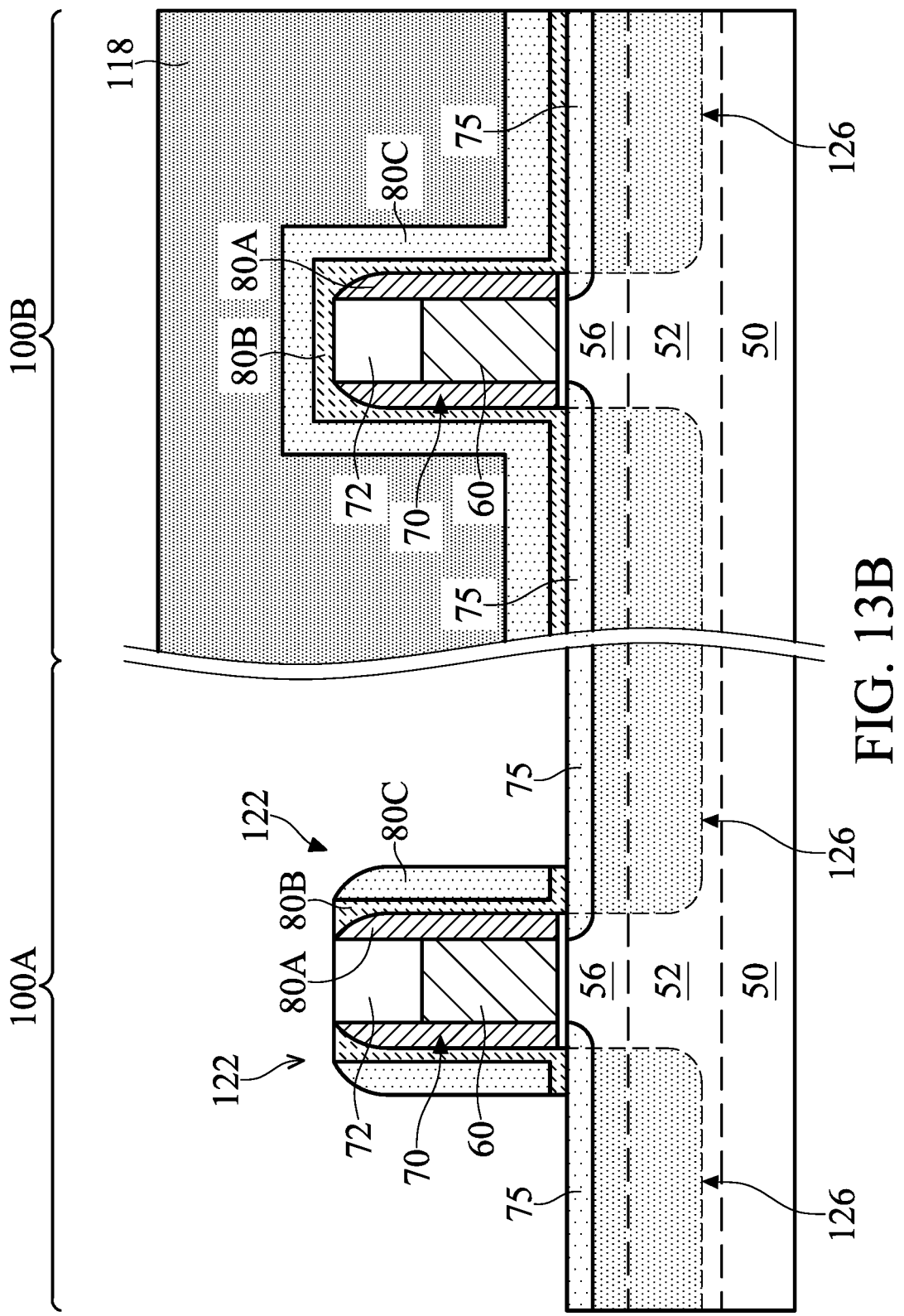
Figure 13C:
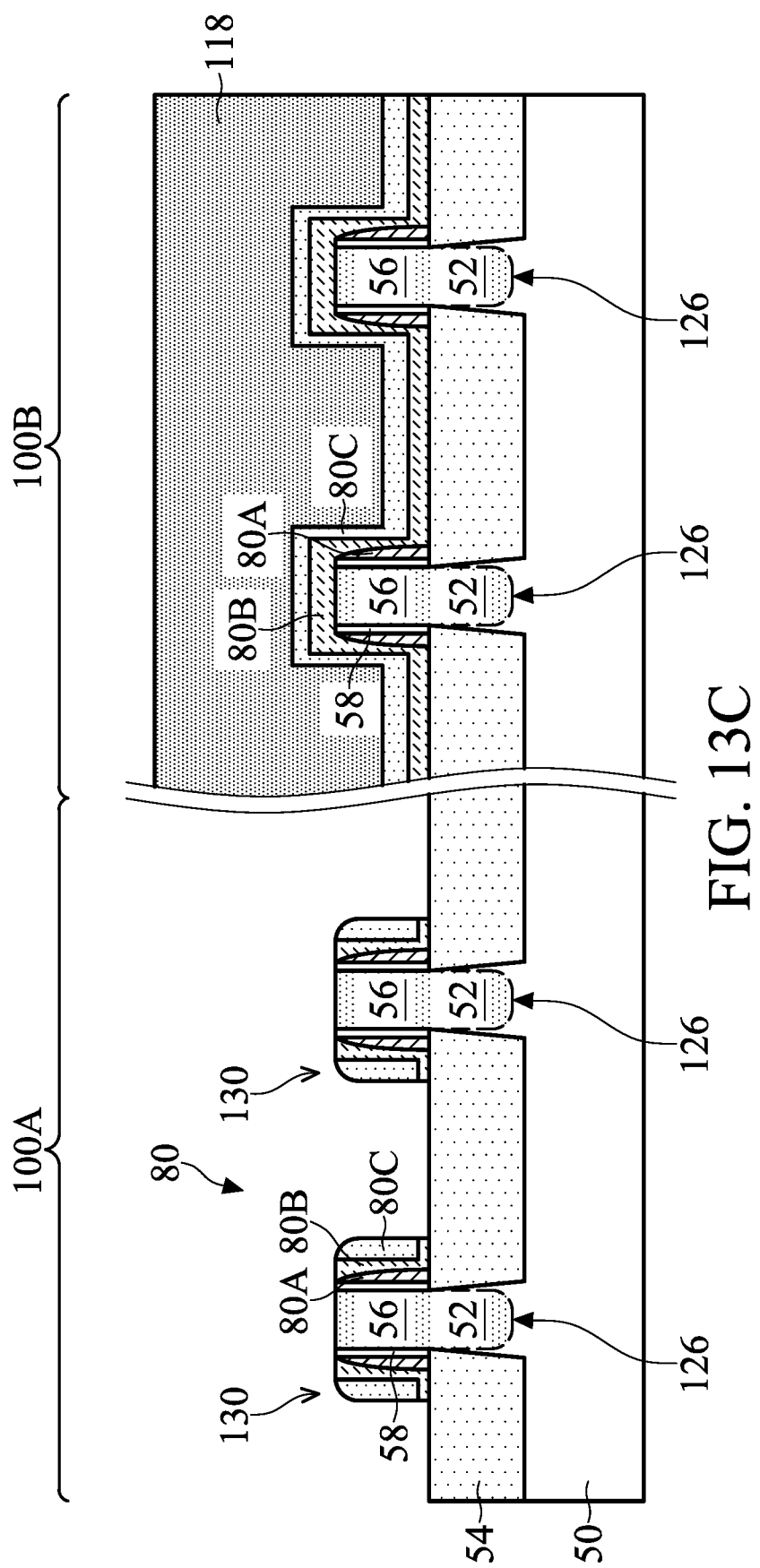

Referring to FIGS. 13A, 13B, and 13C, a patterning process is performed to remove portions of the second spacer layer 80B and the third spacer layer 80C in the first region 100A. Any acceptable patterning process may be used. In some embodiments, mask 118 is formed over the first region 100A and the second region 100B. The mask 118 may be a single layer or may include multiple layers. In some cases, the mask 118 may include a photoresist, though the mask 118 may include other materials. The mask 118 is patterned to expose the first region 100A. The mask 118 may be patterned using suitable photolithography techniques.

Referring to FIGS. 13A, 13B, and 13C, an etching process is performed on portions of the second spacer layer 80B and the third spacer layer 80C, using the mask 118 as a mask. The etching process may be a dry etch process, and may be anisotropic. After performing the etching process, lateral portions of the second spacer layer 80B and the third spacer layer 80C over the LDD regions 75 and over the isolation regions 54 may be removed to expose top surfaces of the fins 56 and the masks 72. Portions of the second spacer layer 80B and the third spacer layer 80C along sidewalls of the dummy gate stack 70 and the fins 56 may remain and form gate spacers 122 and fin spacers 130. In some embodiments, the gate spacers 120 and the fin spacers 130 in the first region 100A are formed at the same time as the gate spacers 122 and the fin spacers 130 in the second region 100B, and in other embodiments, the gate spacers 120 and the fin spacers 130 in the second region 100B are formed before the gate spacers 122 and the fin spacers 130 in the first region 100A are formed. In some embodiments, the second spacer layer 80B may be etched as described above before forming the third spacer layer 80C, and then the third spacer layer 80C may then be etched to form gate spacers 120 and fin spacers 130. In some embodiments, the second spacer layer 80B and the third spacer layer 80C are formed extending over doped regions 126, as shown in FIGS. 13A-C.

Figure 14:
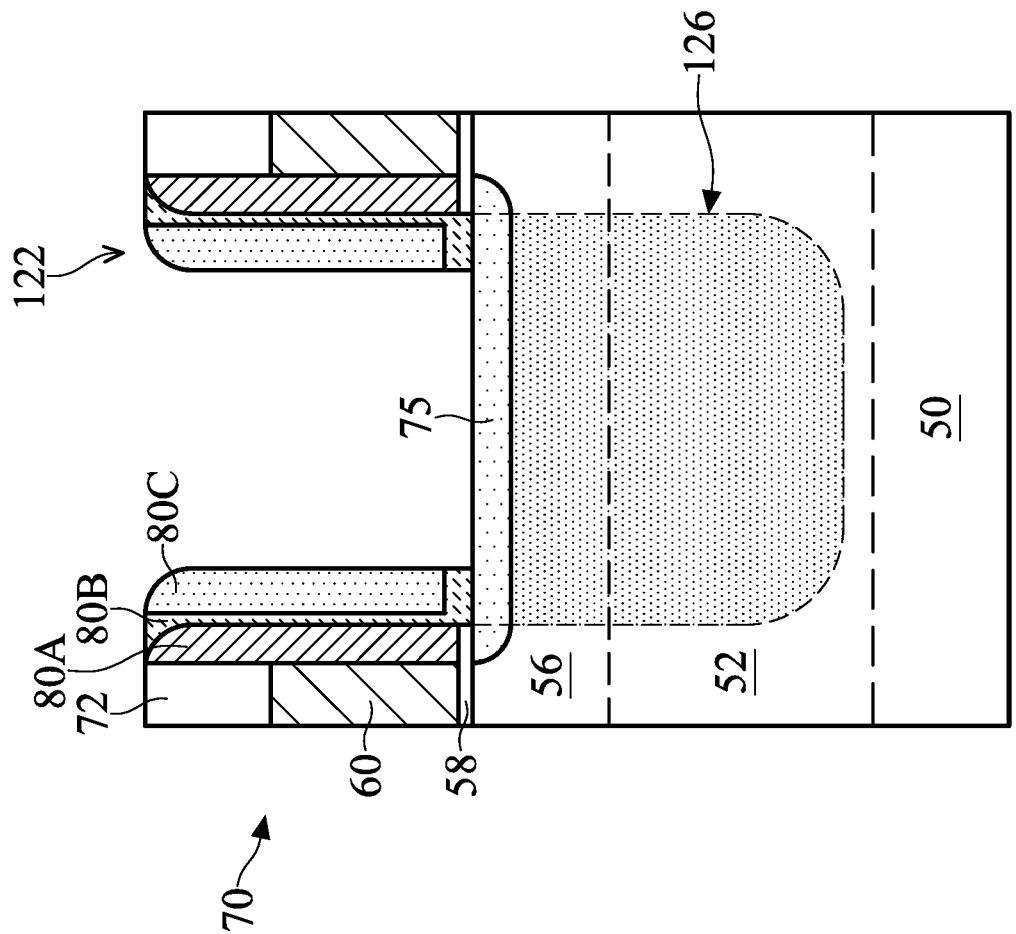
FIG. 14 is a cross-sectional view of intermediate stages in the manufacture of a FinFET device in accordance with some embodiments.
Figure 15:
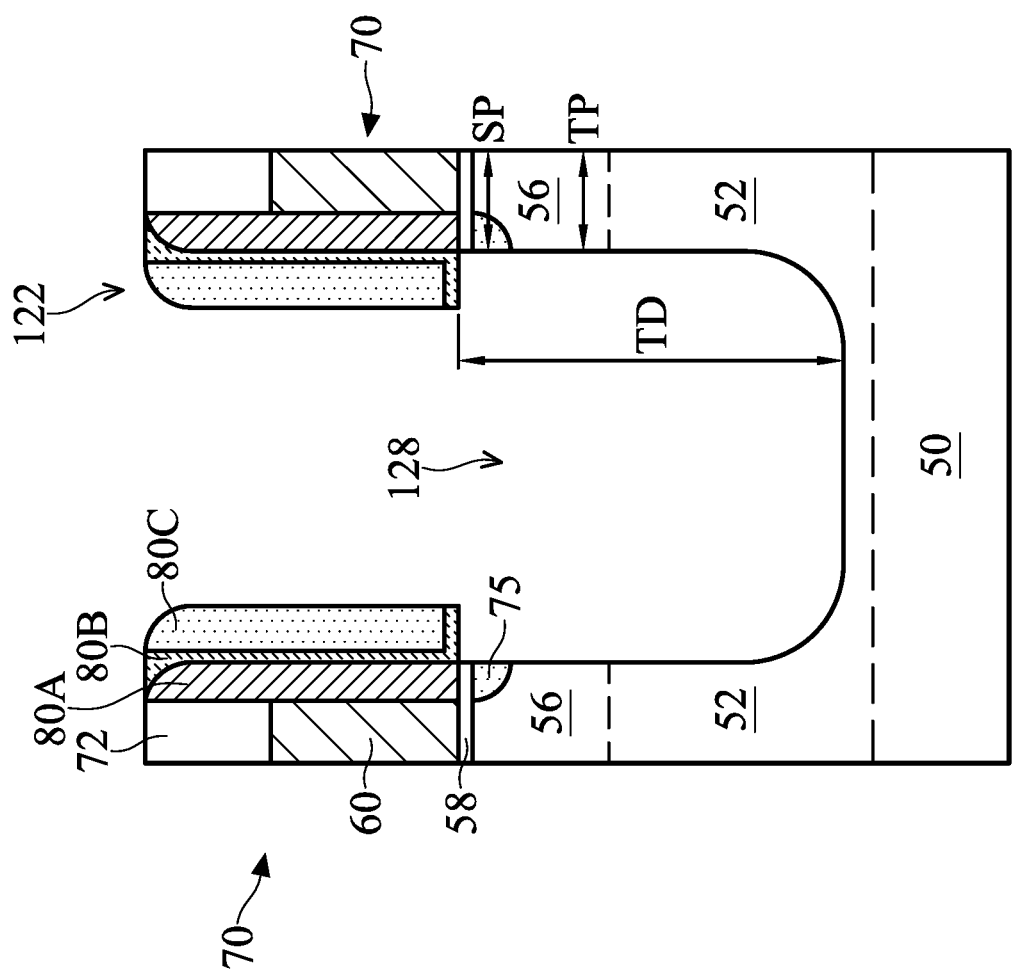
FIG. 15 is a cross-sectional view of intermediate stages in the manufacture of a FinFET device in accordance with some embodiments.

FIGS. 14 through 17C illustrate the formation of epitaxial source/drain regions 82 in the first region 100A and epitaxial source/drain regions 84 in the second region 100B. FIG. 14 and FIG. 15 are illustrated along the reference cross-section B-B illustrated in FIG. 1. FIG. 14 and FIG. 15 illustrate a magnified view of the structure illustrated in region 100A of FIG. 13B, showing an example region between neighboring dummy gate stacks 70 and gate spacers 122. FIG. 14 shows the structure, including a doped region 126 prior to formation of recesses 128.

Referring to FIG. 15, a patterning process is performed on the fins 56 to form recesses 128 in source/drain regions of the fins 56, including in the doped regions 126. The patterning process may be performed in a manner that the recesses 128 are formed between neighboring dummy gate stacks 70 in interior regions of the fins 56 as shown in FIG. 15, or between an isolation region 54 and adjacent dummy gate stacks 70 in end regions of the fins 56. In some embodiments, the patterning process may include a suitable anisotropic dry etching process, while using the dummy gate stacks 70, the spacers 122 and/or isolation regions 54 as a combined mask. The suitable anisotropic dry etching process may include a reactive ion etch (RIE), neutral beam etch (NBE), the like, or a combination thereof. In some embodiments where the RIE is used in the patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, $Cl_2$, a combination thereof, or the like. In some embodiments, the etching process is performed using a gas source having between about 5% by volume and about 30% by volume of HBr and between about 10% by volume and about 30% by volume of $Cl_2$. In some embodiments, the applied voltage bias is between about 0 kV and about 0.5 kV. In some embodiments, the etching process is performed at a temperature between about 20° C. and about 50° C. In some embodiments, the etching process is performed at a pressure between about 6 mTorr and about 20 mTorr. In some embodiments, the patterning process for forming the recesses 128 may also etch isolation regions (illustrated later in FIGS. 16A-22C by dashed lines) or may also etch portions of the masks 72, gate spacers 122, or fin spacers 130.

In some embodiments, the presence of the dopant causes the doped region 126 of fin 56 and semiconductor strip 52 to have a different etch rate during the patterning process than the etch rate of the surrounding regions of fin 56 and semiconductor strip 52. For example, the use of an N-type dopant in doped region 126 (such as the N-type dopants described previously) can cause the doped region 126 to have a higher etch rate during the patterning process. In some cases, the etch rate depends on the concentration of the dopant. For example, the etch rate of a portion of an N-type doped region 126 may be as much as 20% greater than a surrounding region with less or none of the N-type dopant. For example, in some cases a region having an N-type doping between about 5E19 $cm^{-3}$ and about 1E22 $cm^{-3}$ may have an etch rate between about 10% and about 40% higher than an undoped region or a region having an N-type doping between about 1E17 $cm^{-3}$ and about 1E18 $cm^{-3}$. This higher etch rate of the doped region 126 can provide a degree of selectivity, allowing for some control of the shape and dimensions of the recess 128 based at least partially on the shape and dimensions of the doped region 126. As the higher etch rate of the doped region 126 may allow for selectivity between the doped region 126 and other regions of fin 56 and semiconductor strip 52, during the etching process the doped region 126 may be removed selective to the other regions. In this manner, in some embodiments the recesses 128 are self-aligned to the doped regions 126. In some embodiments, the doped regions 126 are self-aligned to a spacer layer such as first spacer layer 80A, and so the recesses 128 are also self-aligned to the spacer layer. In some embodiments, all of the dopants of the doped region 126 are removed during the patterning process, and in other embodiments some amount of dopant remains after the patterning process.

In some embodiments, the use of a plasma doping process to form the doped region 126 (e.g., plasma doping process 124 described above with respect to FIGS. 10B-C) allows for more uniform doping within the fin 56 and semiconductor strip 52 (described above with respect to FIG. 11), which thus allows for more uniform etching of the doped region 126 during formation of recess 128. In some embodiments, the more uniform etching allows for a more uniform profile (e.g., more uniformly vertical sidewalls) of the recess 128. The profile of the recesses 128 determines the shape of the channel region of the fins 56, and a more uniform channel region can improve non-uniform turn-on characteristics of a FinFET device and also reduce resistance of the FinFET device.

FIG. 15 shows that the recess 128 has a surface proximity SP, measured laterally from the middle of the dummy gate 70 to the sidewall of the recess 128, and a tip proximity TP, measured laterally from the middle of the dummy gate 70 to the edge of the recess 126 at half of the depth of the recess 128. In some embodiments, the recess 128 has a trench depth TD, as measured from a top surface of the fins 56, between about 40 nm and about 70 nm, such as about 53 nm. In some embodiments, SP and TP are between about 6.0 nm and about 8.0 nm, such as about 7.0 nm. In some embodiments, the recess 128 formed as described herein allows for a difference between SP and TP measurements of less than about 0.2 nm, such as less than about 0.05 nm. In some embodiments, the recess 128 formed as described herein allows for a difference between SP and TP measurements of less than about 6%, such as less than 2% or less than 1%.

Figure 16A:
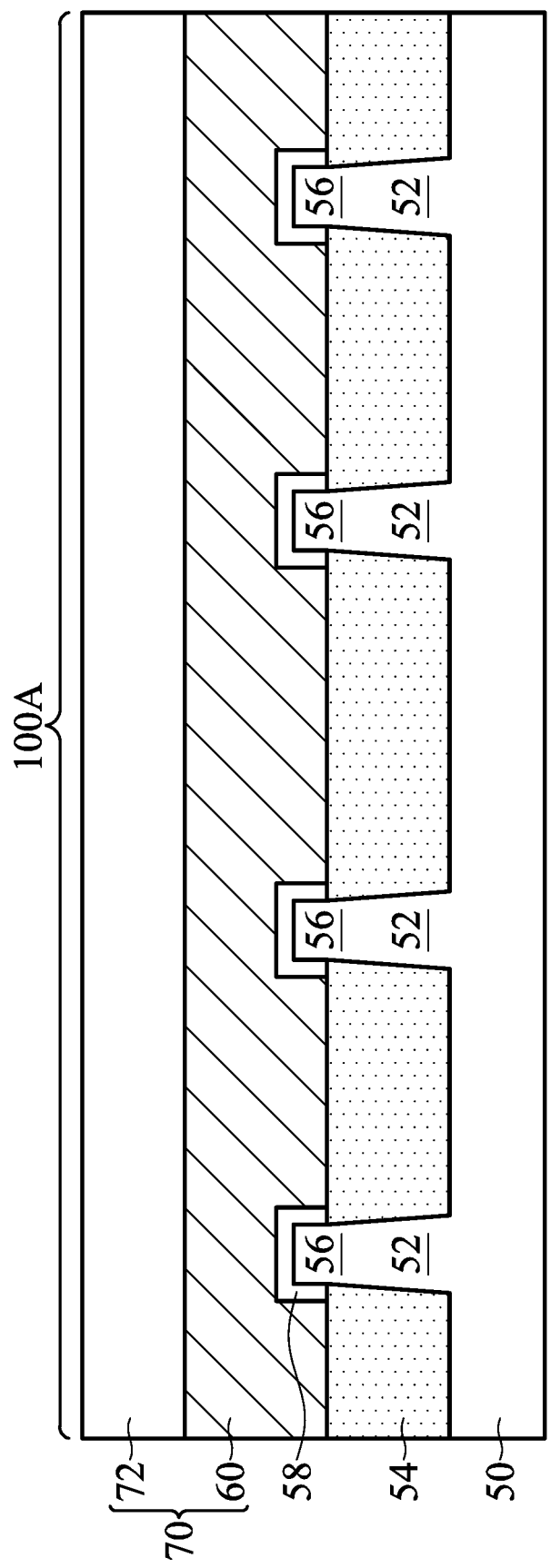
FIGS. 16A-16C are cross-sectional views of intermediate stages in the manufacture of a FinFET device in accordance with some embodiments.
Figure 16B:
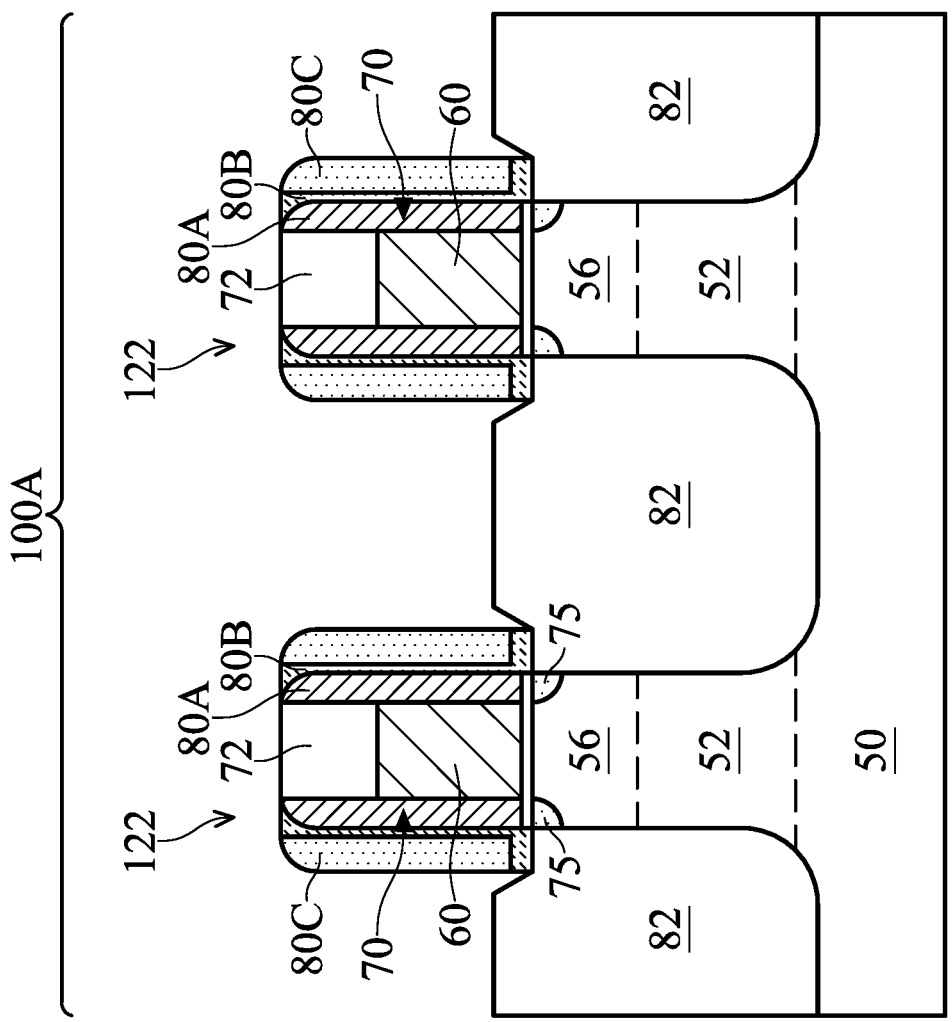
Figure 16C:
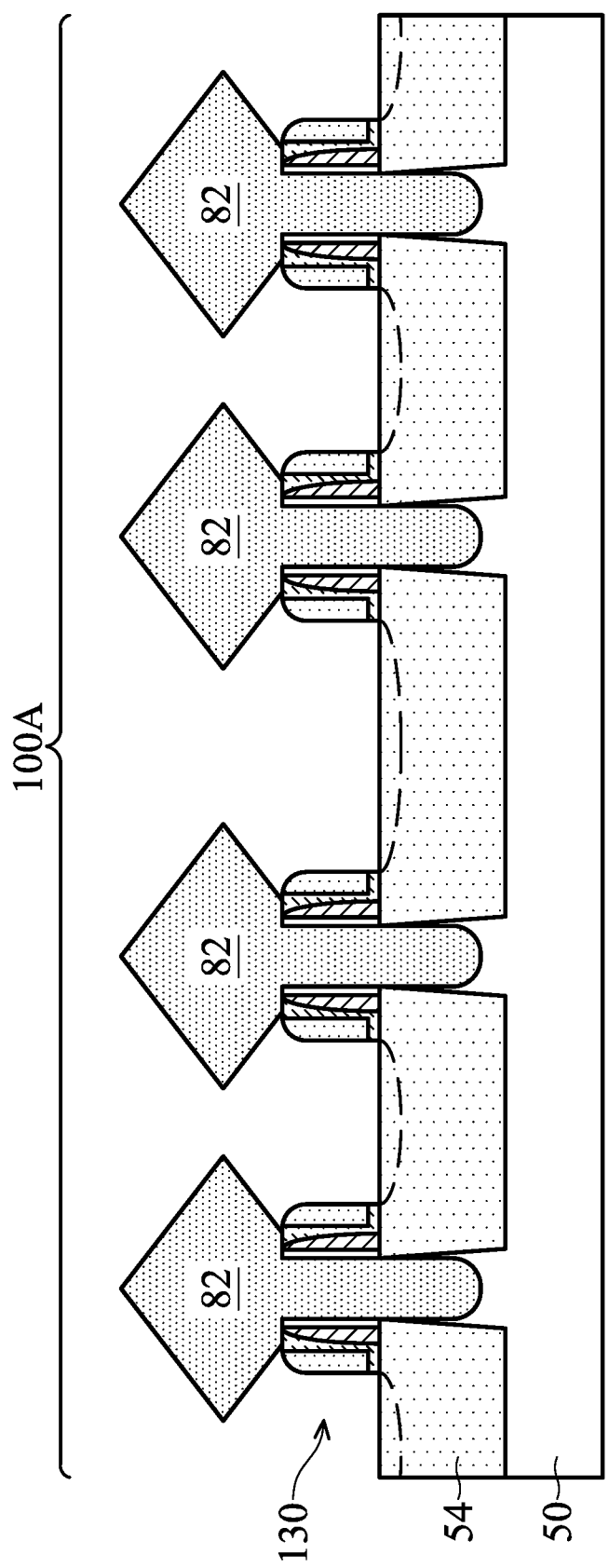

FIGS. 16A, 16B, and 16C illustrate the formation of epitaxial source/drain regions 82 in the first region 100A. In some embodiments, the epitaxial source/drain regions 82 are epitaxially grown in the recesses 128 using metal-organic CVD (MOCVD), molecular beam epitaxy (MBE), liquid phase epitaxy (LPE), vapor phase epitaxy (VPE), selective epitaxial growth (SEG), a combination thereof, or the like. The epitaxial source/drain regions 82 may include any acceptable material, such as any material that is appropriate for N-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. The epitaxial source/drain regions 82 are formed in the fins 56 such that each dummy gate stack 70 is disposed between respective neighboring pairs of the epitaxial source/drain regions 82. In some embodiments the epitaxial source/drain regions 82 may extend past the fins 56 and into the semiconductor strips 52.

Figure 22A:
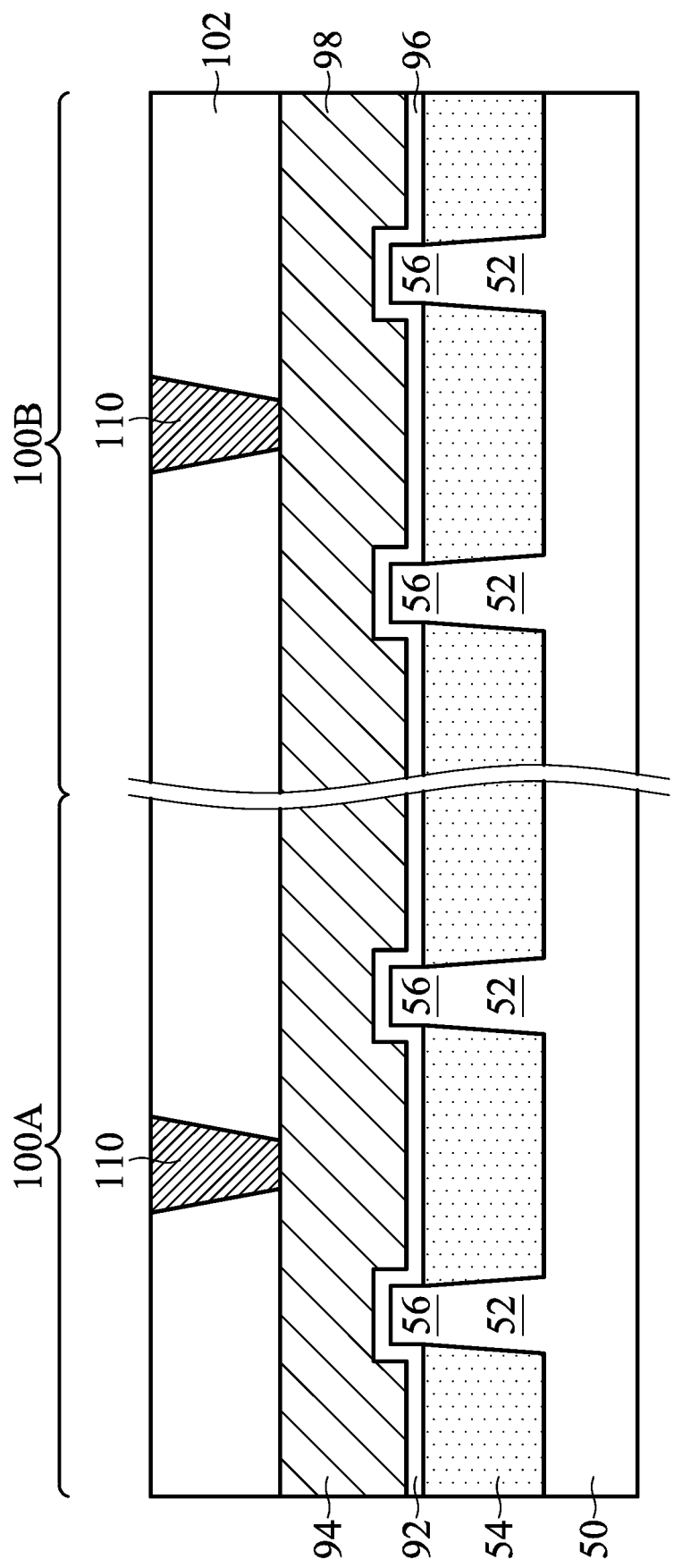
FIGS. 22A-22C are cross-sectional views of intermediate stages in the manufacture of a FinFET device in accordance with some embodiments.
Figure 22B:
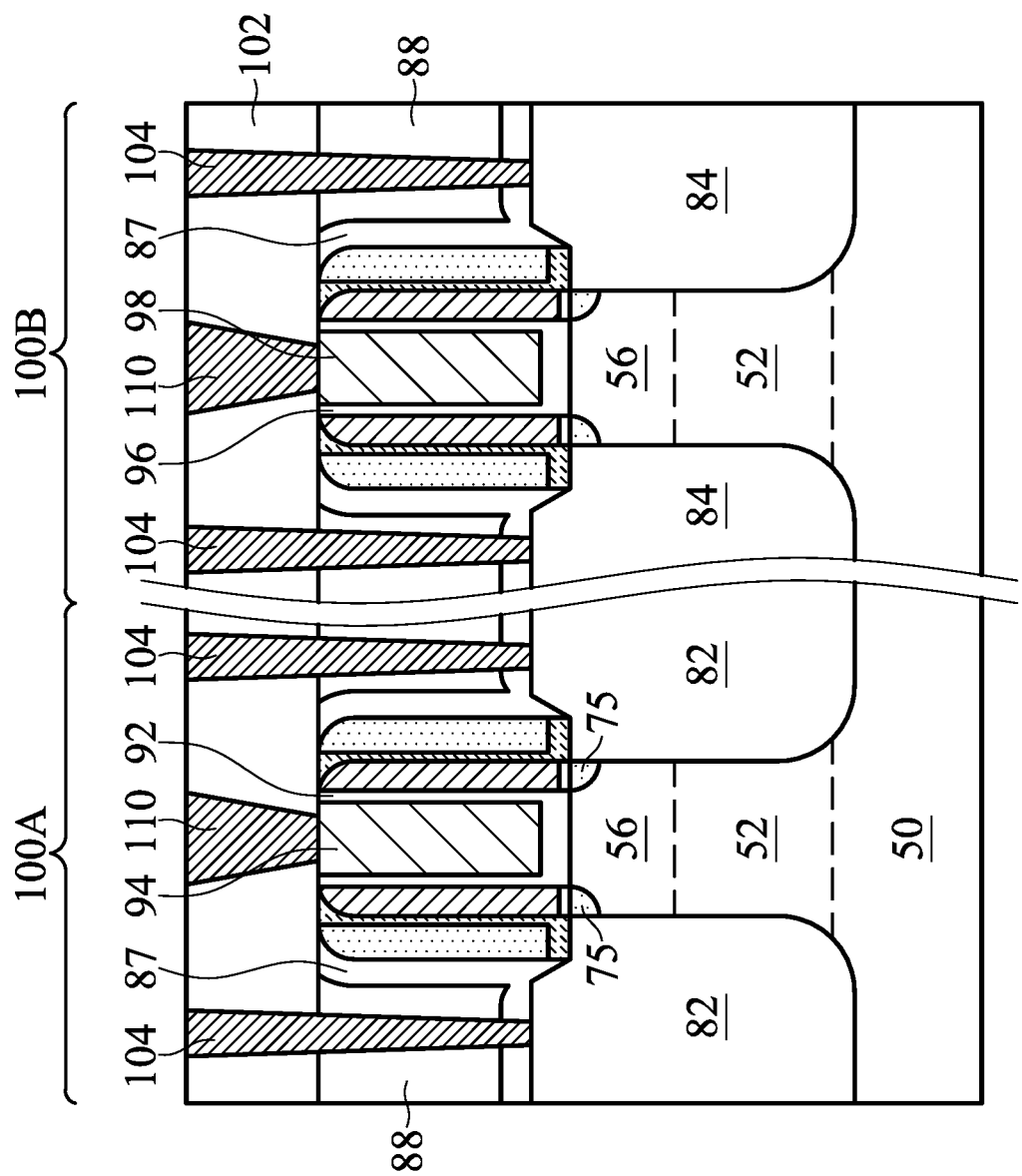
Figure 22C:
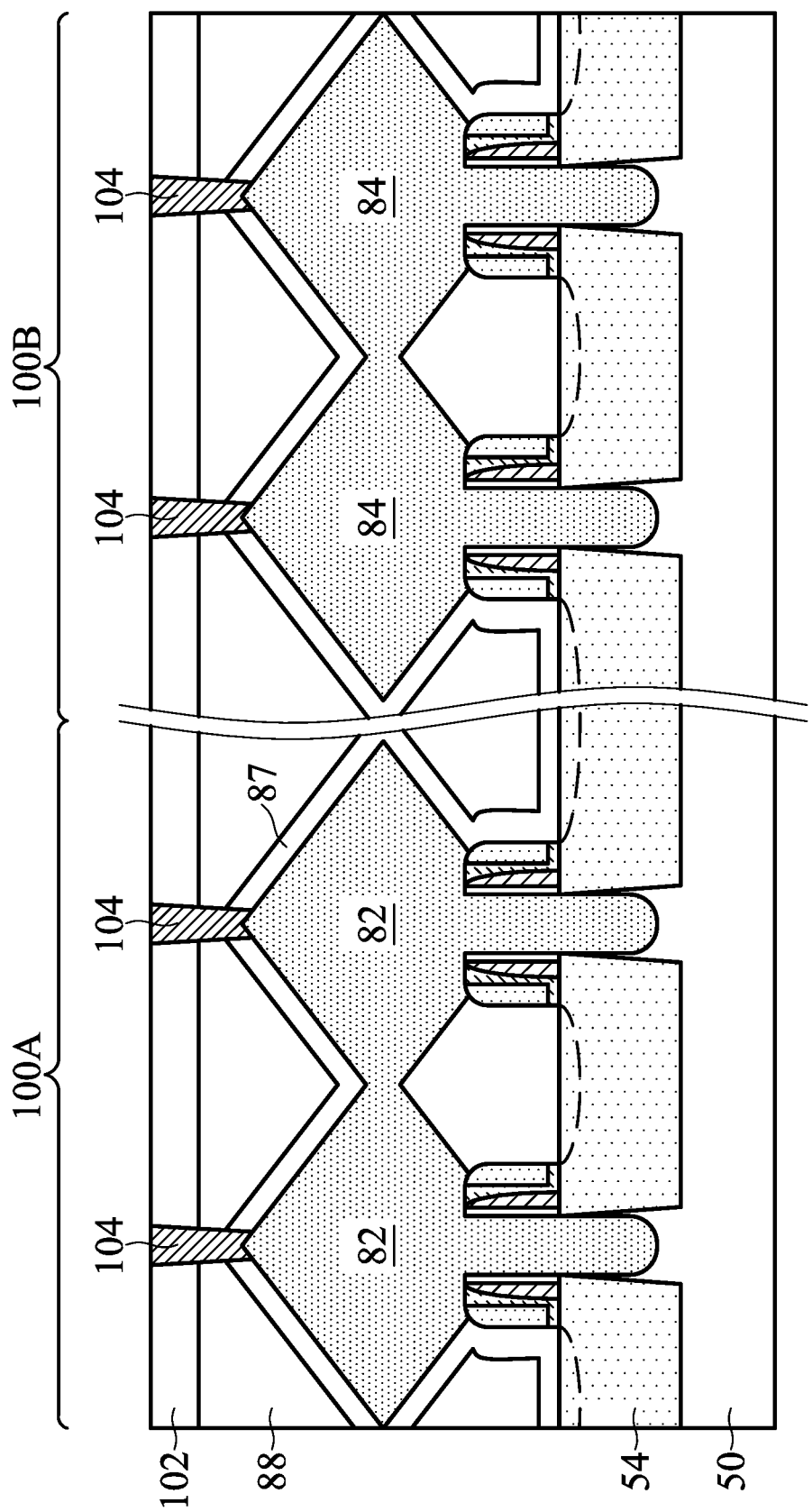

The material of the epitaxial source/drain regions 82 in the first region 100A may be implanted with dopants, similar to the process previously discussed for forming the LDD regions 75, followed by an anneal (see FIGS. 8A, 8B, and 8C). The epitaxial source/drain regions 82 may have an impurity concentration of in a range from about $10^{19}$ $cm^{-3}$ to about $10^{21}$ $cm^{-3}$. The N-type impurities for source/drain regions in the first region 100A, e.g., the NMOS region, may be any of the N-type impurities previously discussed. In other embodiments, the material of the epitaxial source/drain regions 82 may be in situ doped during growth. In the illustrated embodiments, each of the source/drain regions 82 is physically separate from other source/drain regions 82. In other embodiments, two or more adjacent source/drain regions 82 may be merged. Such an embodiment is depicted in FIGS. 22A, 22B, and 22C, such that two adjacent source/drain regions 82 are merged to form a common source/drain region. In some embodiments, more than two adjacent source/drain regions 82 may be merged.

Figure 17A:
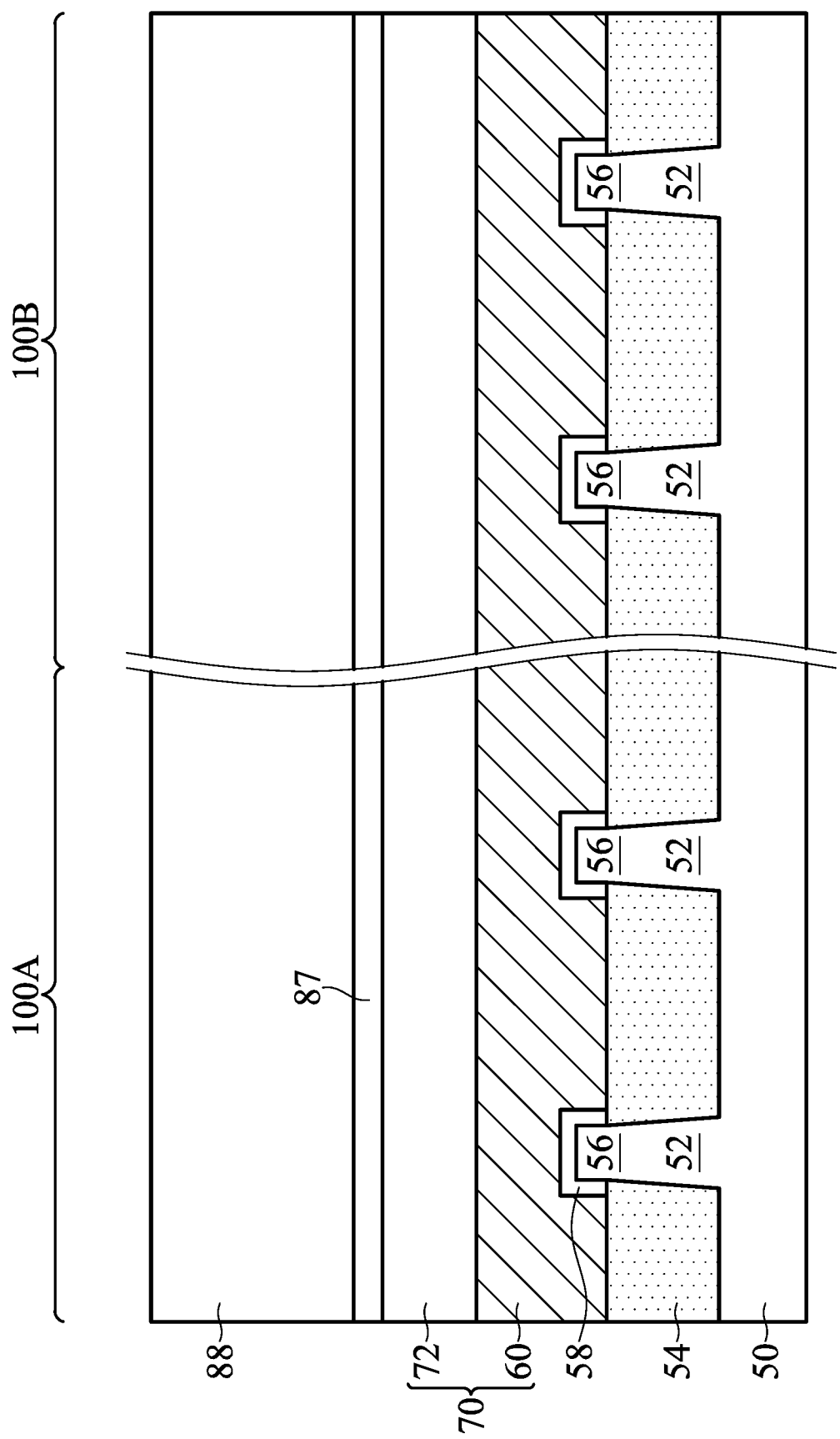
FIGS. 17A-17C are cross-sectional views of intermediate stages in the manufacture of a FinFET device in accordance with some embodiments.
Figure 17B:
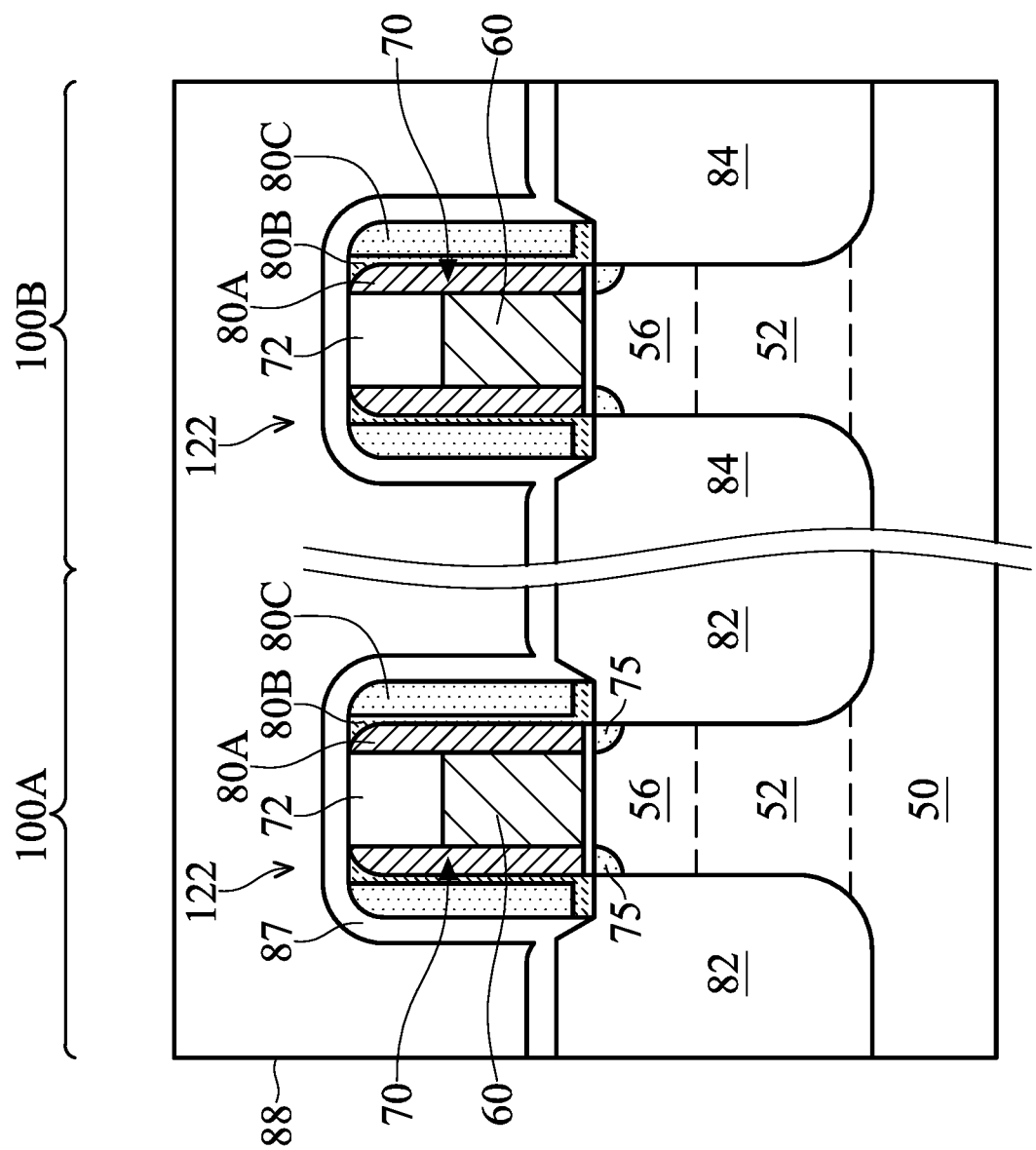
Figure 17C:
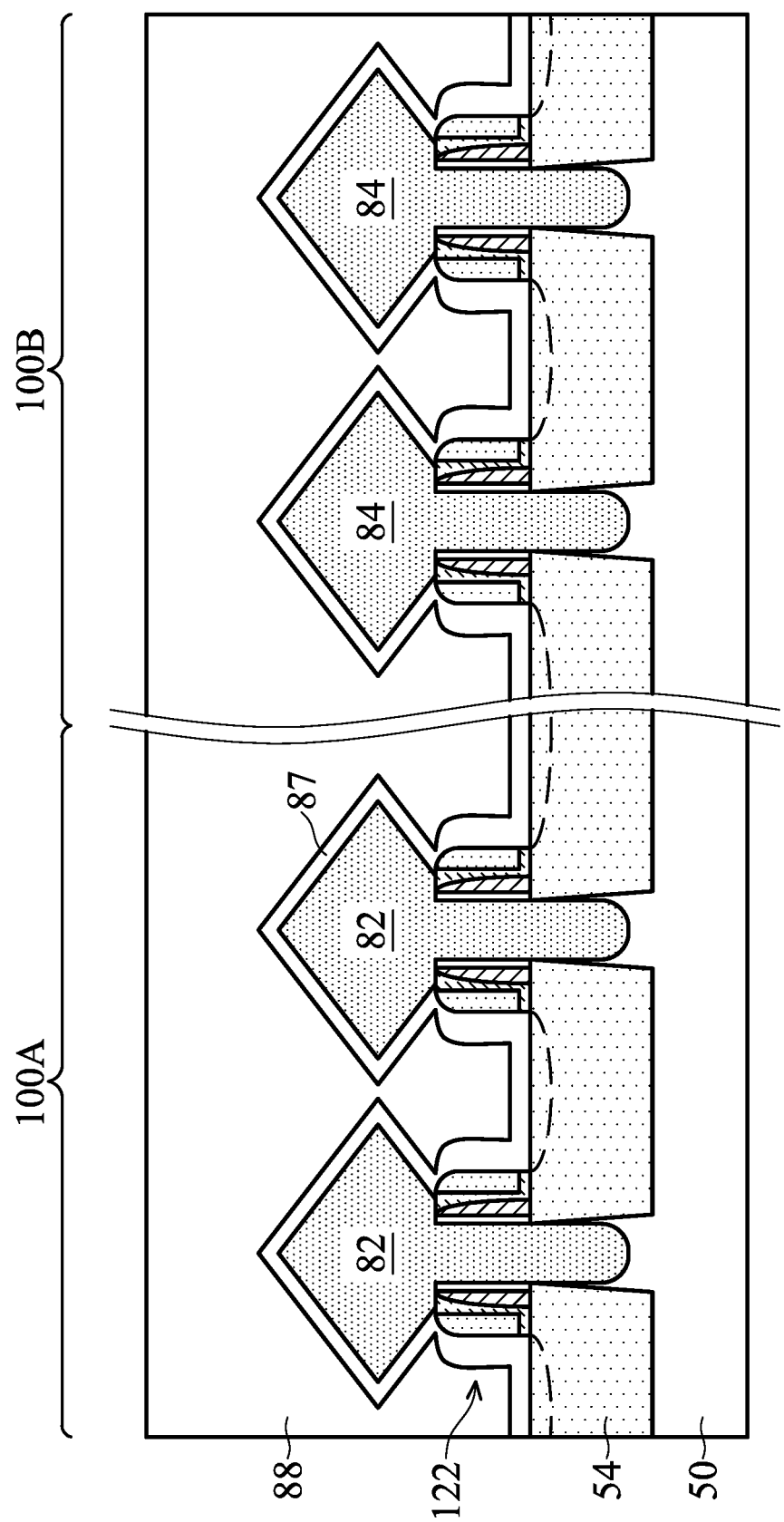

Referring to FIGS. 17A, 17B, and 17C, after forming the epitaxial source/drain regions 82 in the first region 100A, epitaxial source/drain regions 84 are formed in the second region 100B. In some embodiments, the epitaxial source/drain regions 84 are formed in the second region 100B using similar methods as the epitaxial source/drain regions 82 in the first region 100A described above with reference to FIGS. 14 through 16C, and the detailed description is not repeated for the sake of brevity. In some embodiments, during the formation of the epitaxial source/drain regions 84 in the second region 100B, the first region 100A may be masked (not shown). Subsequently, the source/drain regions of the fins 56 in the second region 100B are etched to form recesses (shown as filled with the epitaxial source/drain regions 84 in FIGS. 17B and 17C) similar to the recesses 128 (see FIG. 15). The recesses in the second region 100B may be formed using similar method as the recesses 128 in the first region, described above with reference to FIGS. 14-15, and the description is not repeated herein for the sake of brevity. In some embodiments, the epitaxial source/drain regions 84 in the second region 100B may be formed before forming the epitaxial source/drain regions 82 in first region 100A.

The epitaxial source/drain regions 84 in the second region 100B may be epitaxially grown in the recesses using MOCVD, MBE, LPE, VPE, SEG, a combination thereof, or the like. The epitaxial source/drain regions 84 in the second region 100B may include any acceptable material, such as any material that is appropriate for P-type FinFETs. For example, if the fin 56 is silicon, the epitaxial source/drain regions 84 may include SiGe, SiGeB, Ge, GeSn, or the like. The epitaxial source/drain regions 84 may have surfaces raised from respective surfaces of the fins 56 and may have facets. In the second region 100B, epitaxial source/drain regions 84 are formed in the fins 56 such that each dummy gate 76 is disposed between respective neighboring pairs of the epitaxial source/drain regions 84. In some embodiments epitaxial source/drain regions 84 may extend past the fins 56 and into the semiconductor strips 52.

The material of the epitaxial source/drain regions 84 in the second region 100B may be implanted with dopants, similar to the process previously discussed for forming the LDD regions 79, followed by an anneal (see FIGS. 8A, 8B, and 8C). The source/drain regions 84 may have an impurity concentration in a range from about $10^{19}$ cm$^{-3}$ to about $10^{21}$ cm$^{-3}$. The P-type impurities for the source/drain regions 84 in the second region 100B, e.g., the PMOS region, may be any of the P-type impurities previously discussed. In other embodiments, the epitaxial source/drain regions 84 may be in situ doped during growth. In the illustrated embodiments, each of the source/drain regions 84 is physically separate from other source/drain regions 84. In other embodiments, two or more adjacent source/drain regions 84 may be merged. Such an embodiment is depicted in FIGS. 22A, 22B, and 22C, such that two adjacent source/drain regions 84 are merged to form a common source/drain region. In some embodiments, more than two adjacent source/drain regions 84 may be merged.

In some embodiments, the epitaxial source/drain regions 82 in the first region 100A may be implanted with dopant separately from the epitaxial source/drain regions 84 in the second region 100B. For example, a mask (not shown), such as a photoresist, may be formed over the first region 100A, while exposing the second region 100B, and dopants may be implanted into the epitaxial source/drain regions 84 in the second region 100B. The mask may then be removed. Subsequently, a second mask (not shown), such as a photoresist, may be formed over the second region 100B, while exposing the first region 100A, and dopants may be implanted into the epitaxial source/drain regions 82 in the first region 100A. The second mask may then be removed.

Referring further to FIGS. 17A, 17B, and 17C, an etch stop layer 87 and an interlayer dielectric (ILD) 88 are deposited over the dummy gate stacks 70 and 76, and over the source/drain regions 82 and 84. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer 87 is used as a stop layer while patterning the ILD 88 to form openings for subsequently formed contacts. Accordingly, a material for the etch stop layer 87 may be chose such that the material of the etch stop layer 87 has a lower etch rate than the material of ILD 88.

Figure 18A:
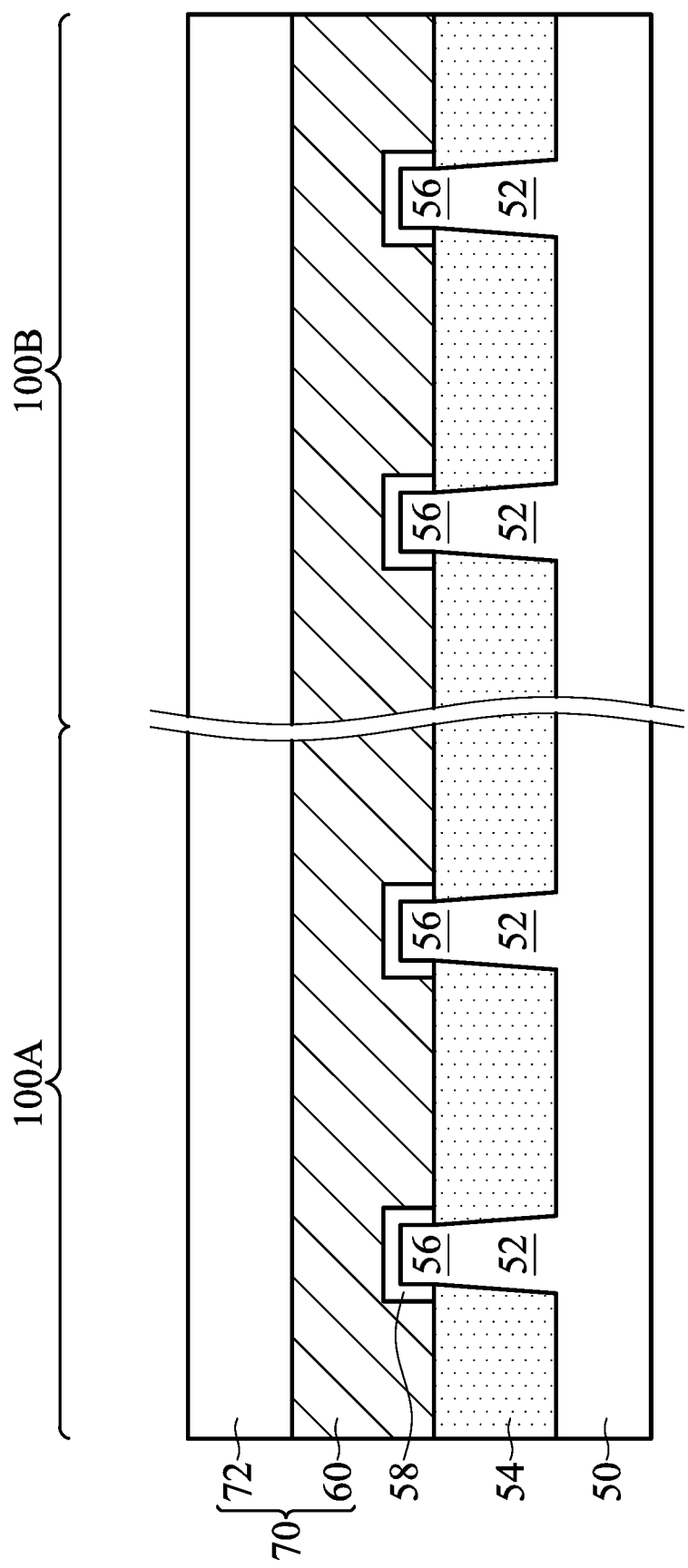
FIGS. 18A-18C are cross-sectional views of intermediate stages in the manufacture of a FinFET device in accordance with some embodiments.
Figure 18B:
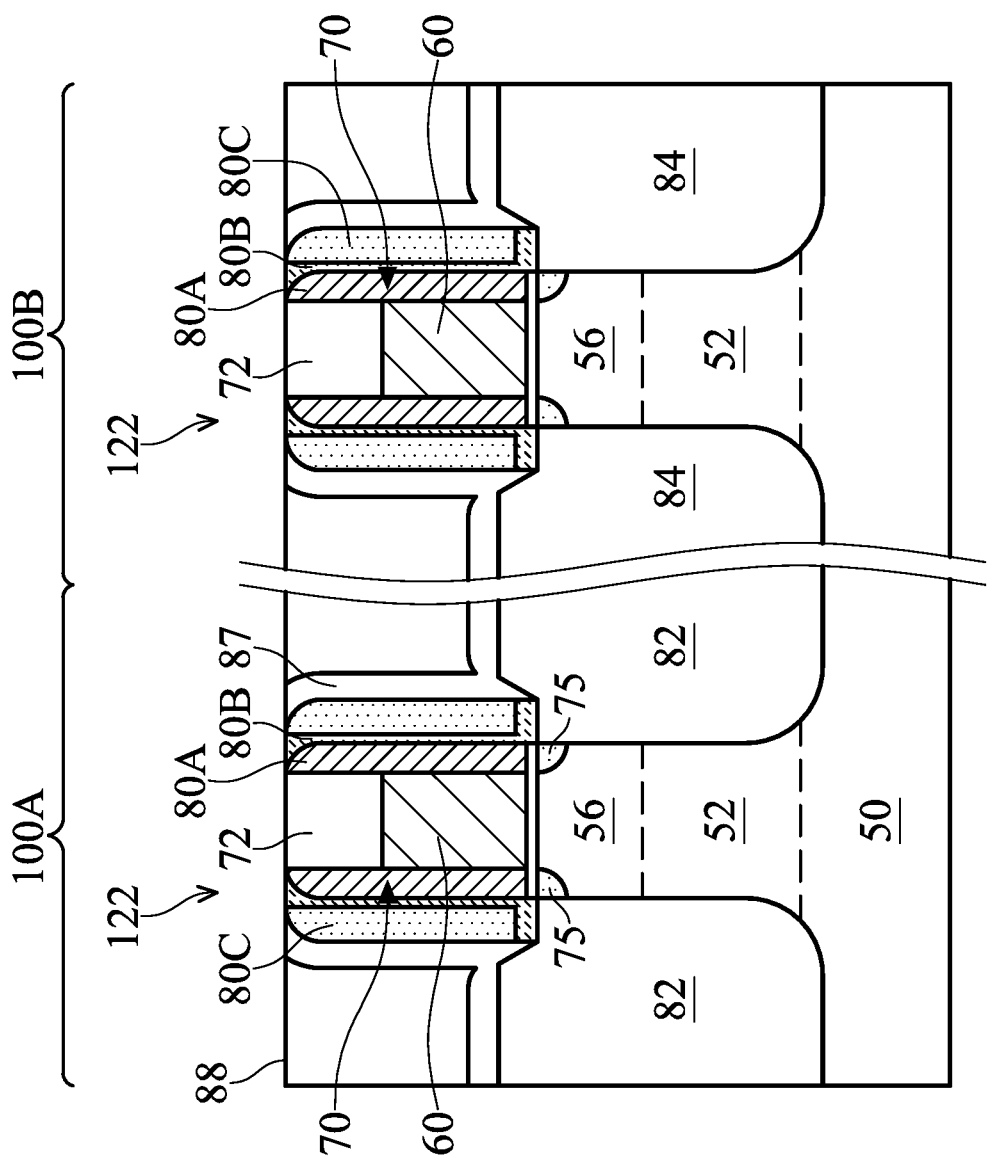
Figure 18C:
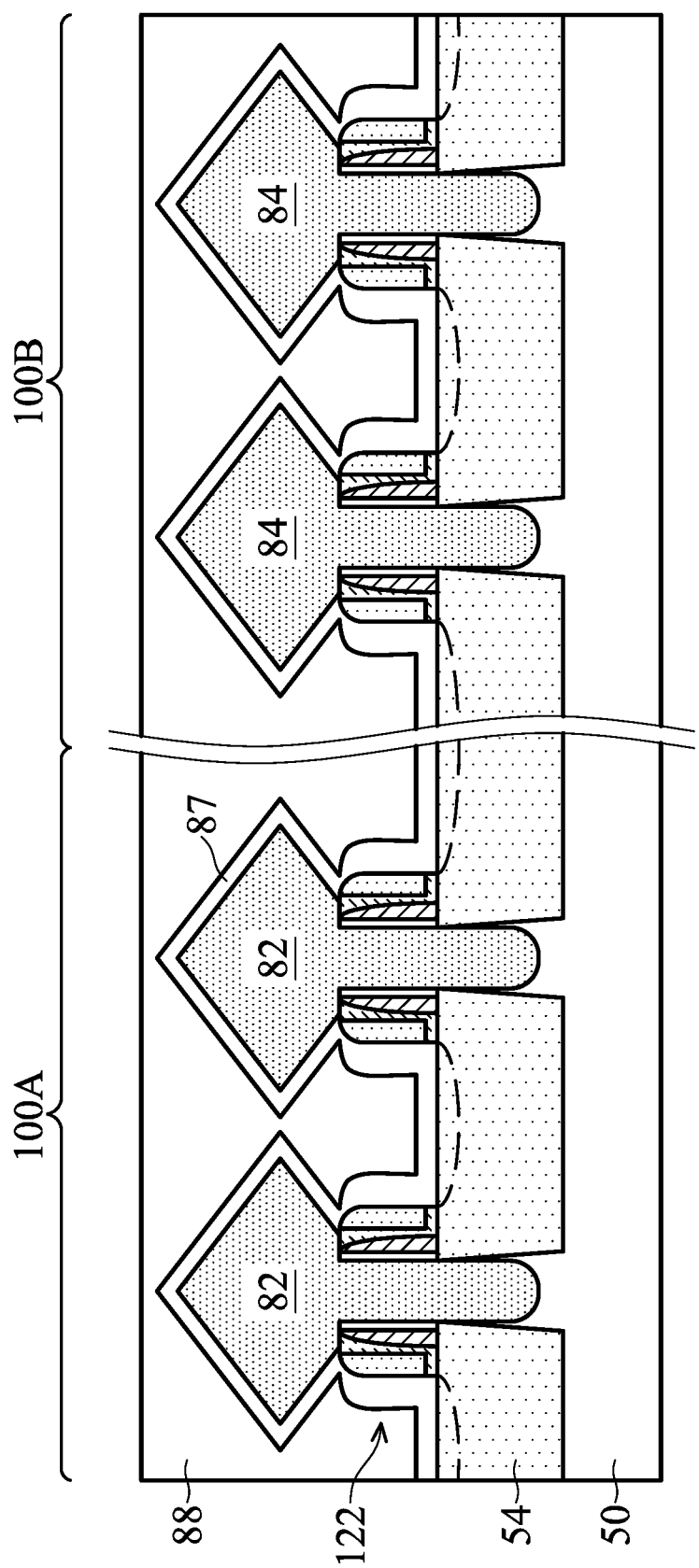

Referring to FIGS. 18A, 18B, and 18C, a planarization process, such as a CMP, may be performed to level the top surface of ILD 88 with the top surfaces of the dummy gate stacks 70. After the planarization process, top surfaces of the dummy gate stacks 70 are exposed through the ILD 88. In some embodiments, the CMP may also remove the masks 72, or portions thereof, on the dummy gate stacks 70.

Figure 19A:
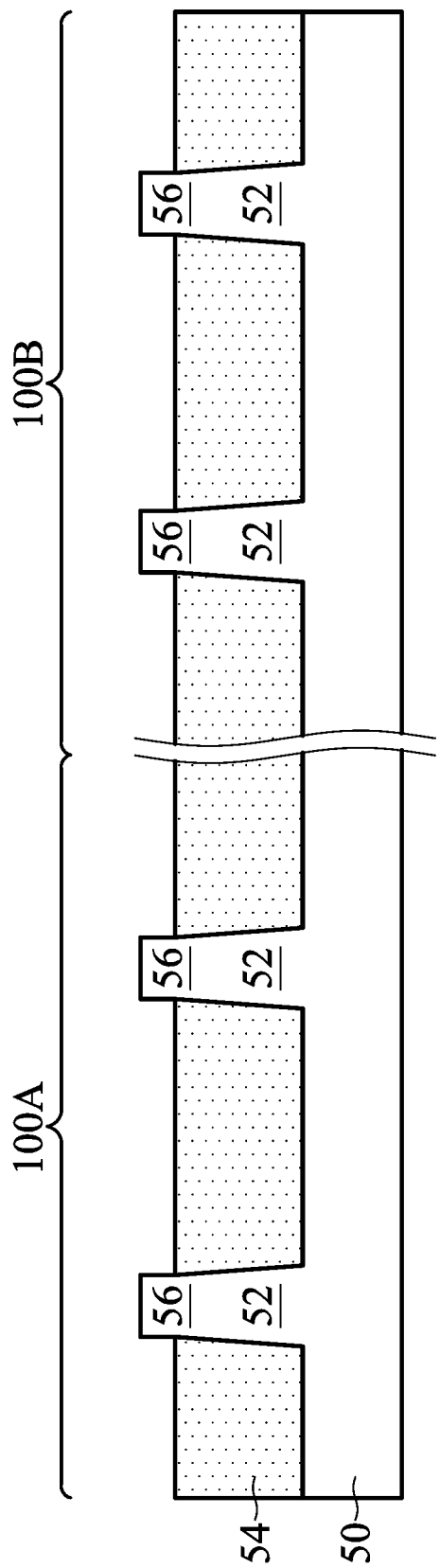
FIGS. 19A-19C are cross-sectional views of intermediate stages in the manufacture of a FinFET device in accordance with some embodiments.
Figure 19B:
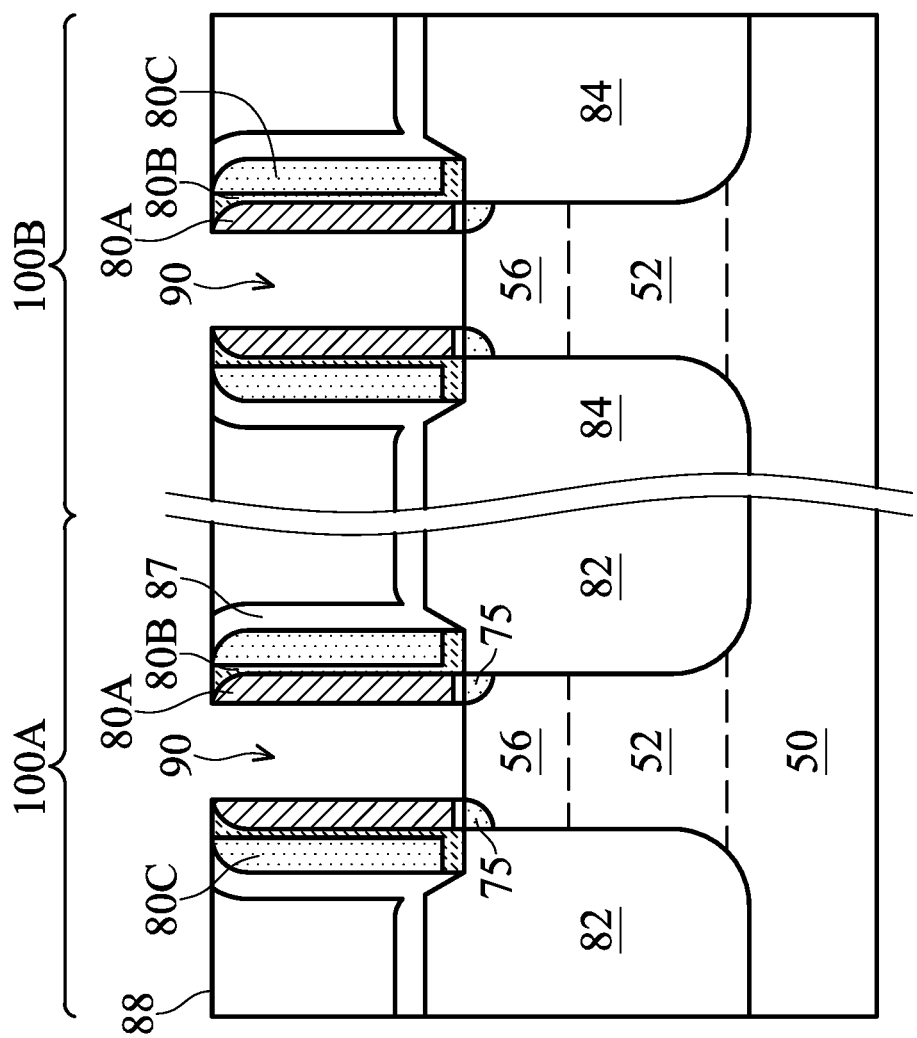
Figure 19C:
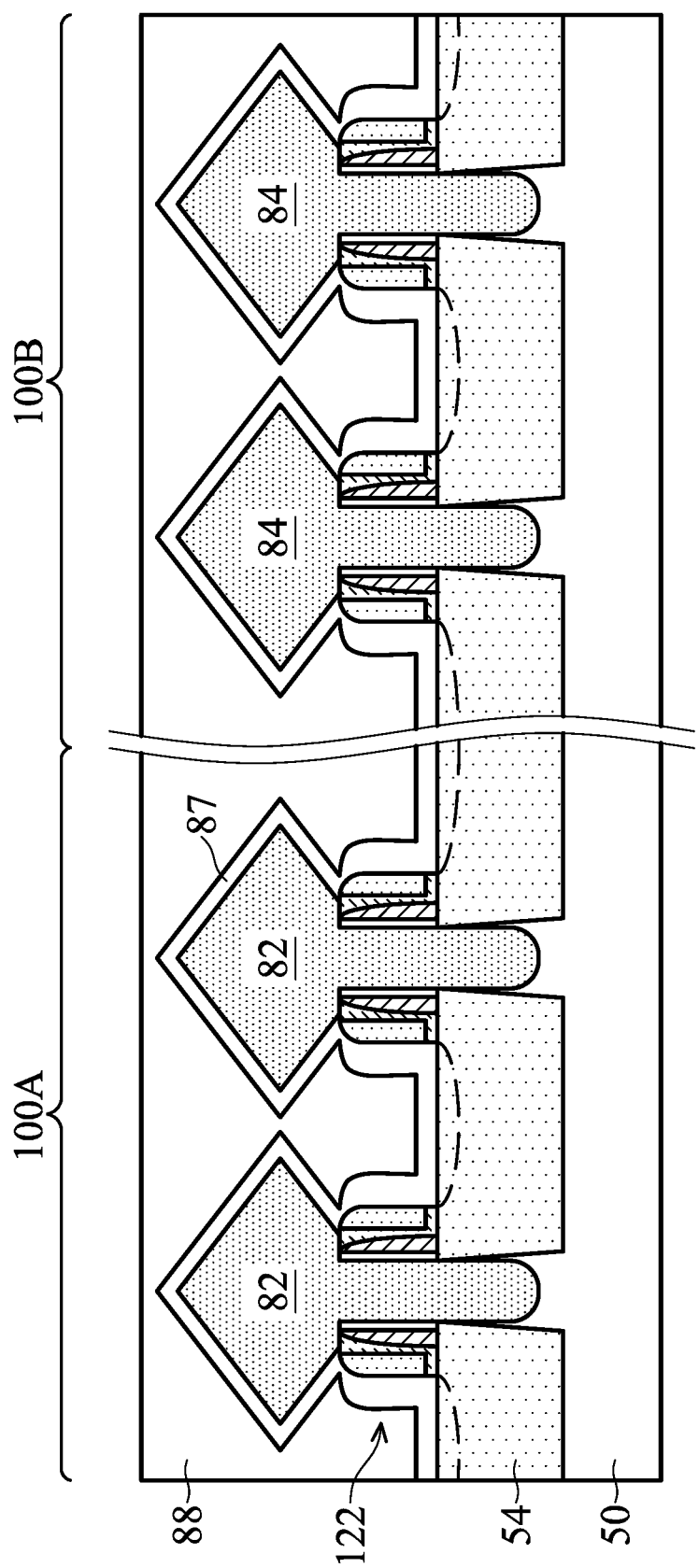

Referring to FIGS. 19A, 19B, and 19C, remaining portions of masks 72 and the dummy gate stacks 70 are removed in one or more etching steps, so that recesses 90 are formed. Each of the recesses 90 exposes a channel region of a respective fin 56. Each channel region is disposed between neighboring pairs of the epitaxial source/drain regions 82 in the first region 100A or between neighboring pairs of the epitaxial source/drain regions 84 in the second region 100B. During the removal, the dummy dielectric layer 58 may be used as an etch stop layer when the dummy gate stacks 70 are etched. The dummy dielectric layer 58 may then be removed after the removal of the dummy gate stacks 70.

Figure 20A:
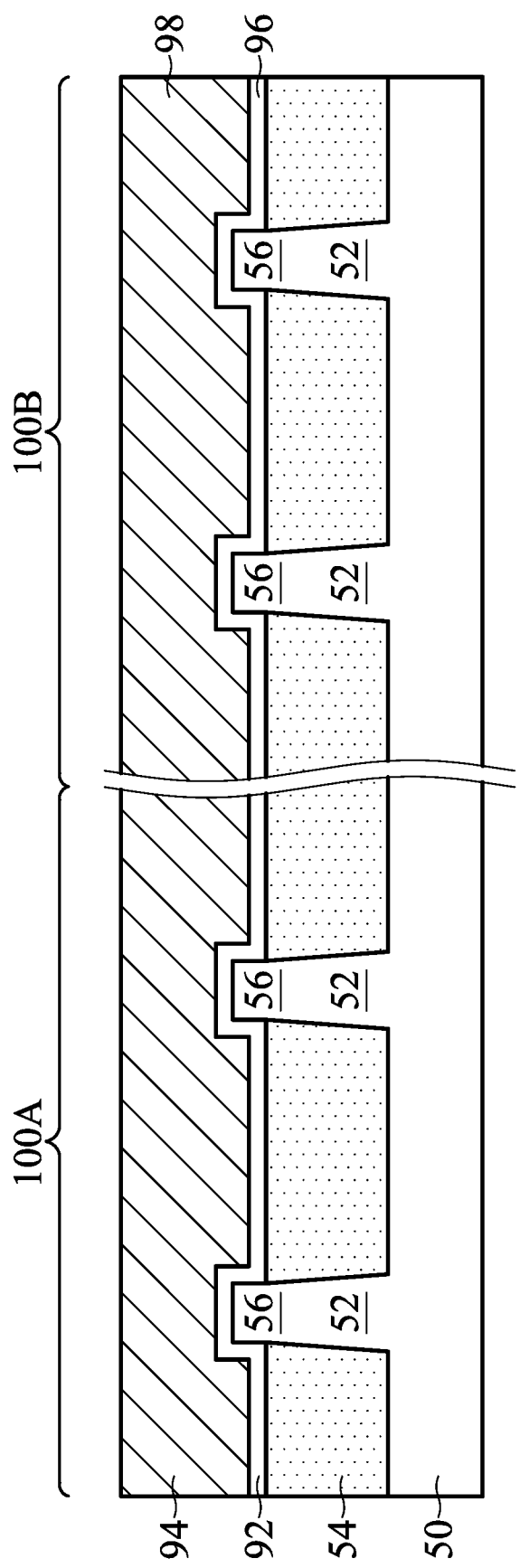
FIGS. 20A-20C are cross-sectional views of intermediate stages in the manufacture of a FinFET device in accordance with some embodiments.
Figure 20B:
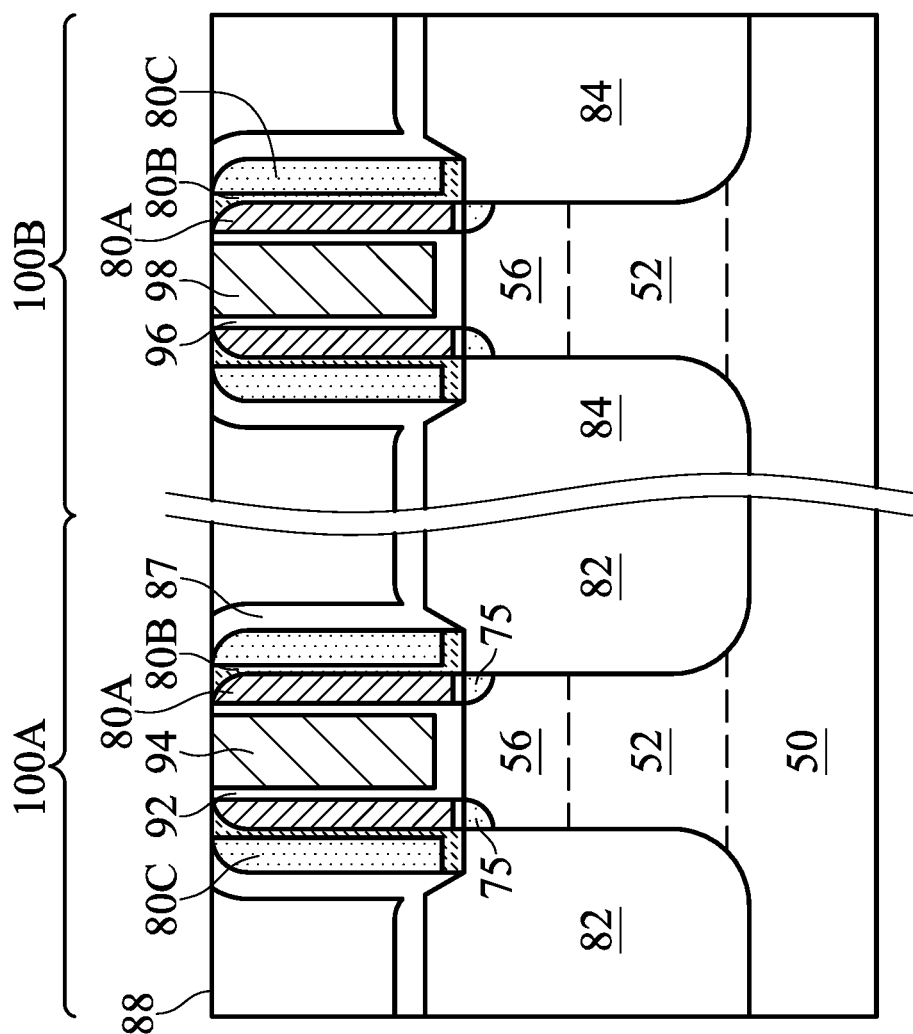
Figure 20C:
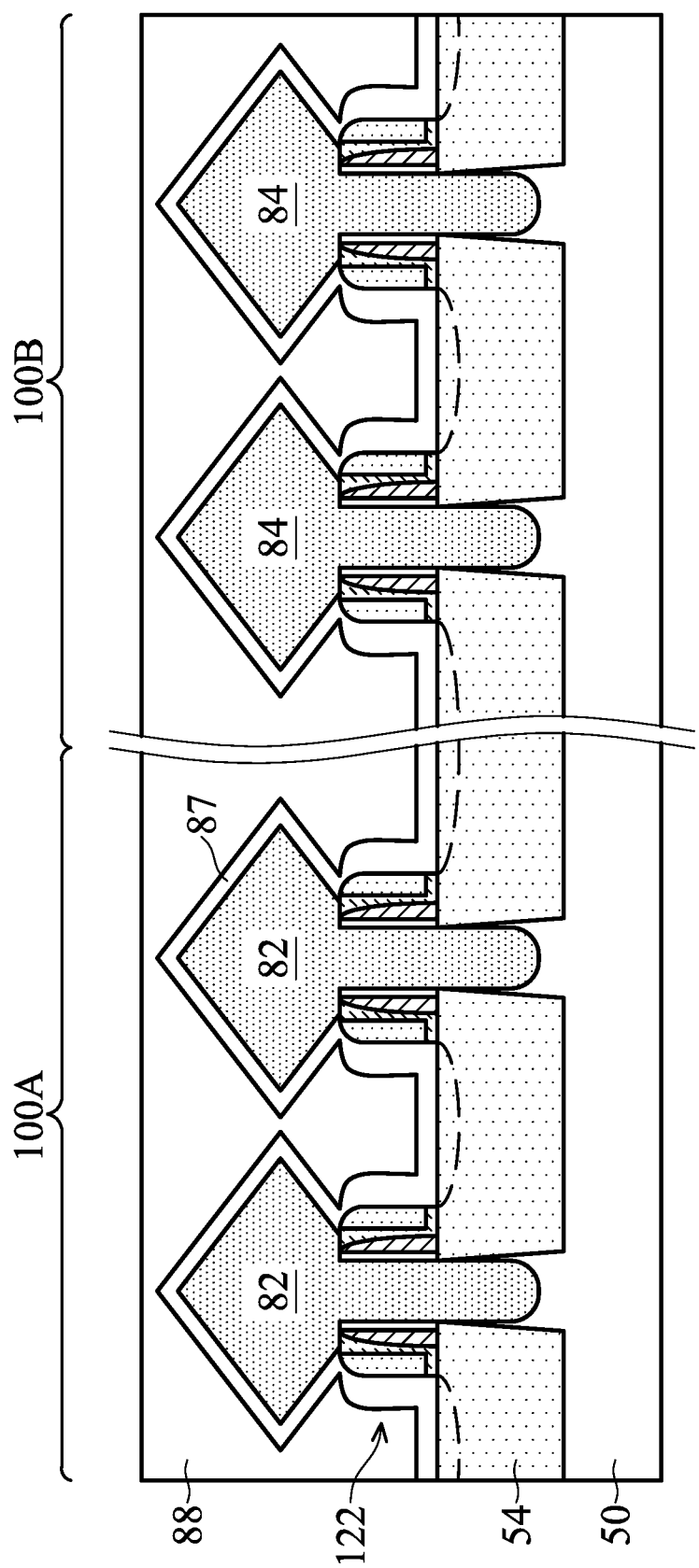

Referring to FIGS. 20A, 20B, and 20C, gate dielectric layers 92 and 96, and gate electrodes 94 and 98 are formed for replacement gates in the first region 100A and the second region 100B, respectively. The gate dielectric layers 92 and 96 are deposited conformally in the recesses 90, such as on the top surfaces and the sidewalls of the fins 56, on sidewalls of the gate spacers 122 and fin spacers 130, respectively, and on a top surface of the ILD 88. In some embodiments, the gate dielectric layers 92 and 96 include silicon oxide, silicon nitride, or multilayers thereof. In other embodiments, the gate dielectric layers 92 and 96 include a high-k dielectric material, and in these embodiments, the gate dielectric layers 92 and 96 may have a k value greater than about 7.0, and may include a metal oxide or a silicate of Hf, Al, Zr, La, Mg, Ba, Ti, Pb, and combinations thereof. The formation methods of the gate dielectric layers 92 and 96 may include Molecular-Beam Deposition (MBD), ALD, PECVD, a combination thereof, or the like.

Next, the gate electrodes 94 and 98 are deposited over the gate dielectric layers 92 and 96, respectively, and fill the remaining portions of the recesses 90. The gate electrodes 94 and 98 may be made of a metal-containing material such as TiN, TaN, TaC, Co, Ru, Al, Ag, Au, W, Ni, Ti, Cu, combinations thereof, or multi-layers thereof. After the filling of the gate electrodes 94 and 98, a planarization process, such as a CMP, may be performed to remove the excess portions of the gate dielectric layers 92 and 96, and the gate electrodes 94 and 98, which excess portions are over the top surface of ILD 88. The resulting remaining portions of material of the gate electrodes 94 and 98, and the gate dielectric layers 92 and 96 thus form replacement gates of the resulting FinFETs.

In some embodiments, the formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 21A:
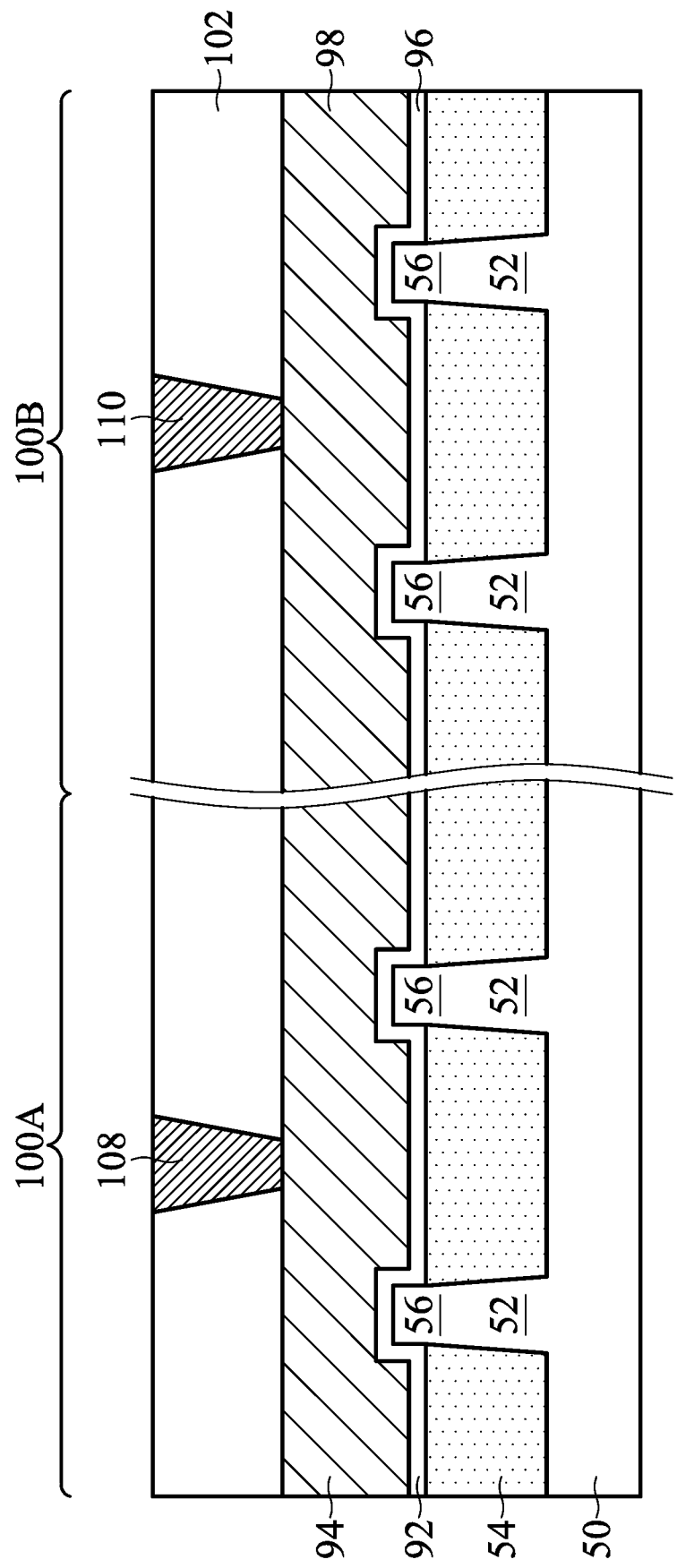
FIGS. 21A-21C are cross-sectional views of intermediate stages in the manufacture of a FinFET device in accordance with some embodiments.
Figure 21B:
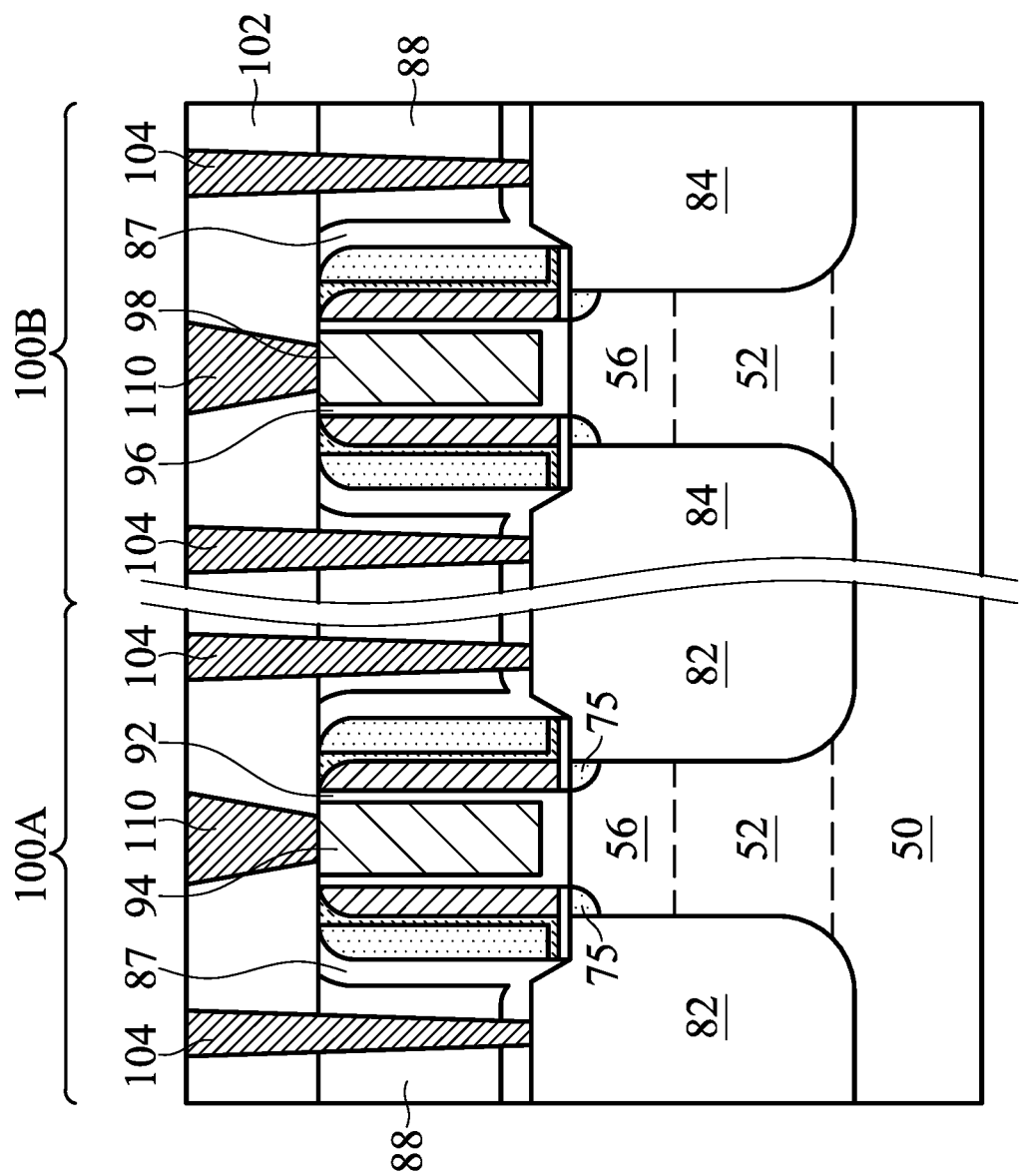
Figure 21C:
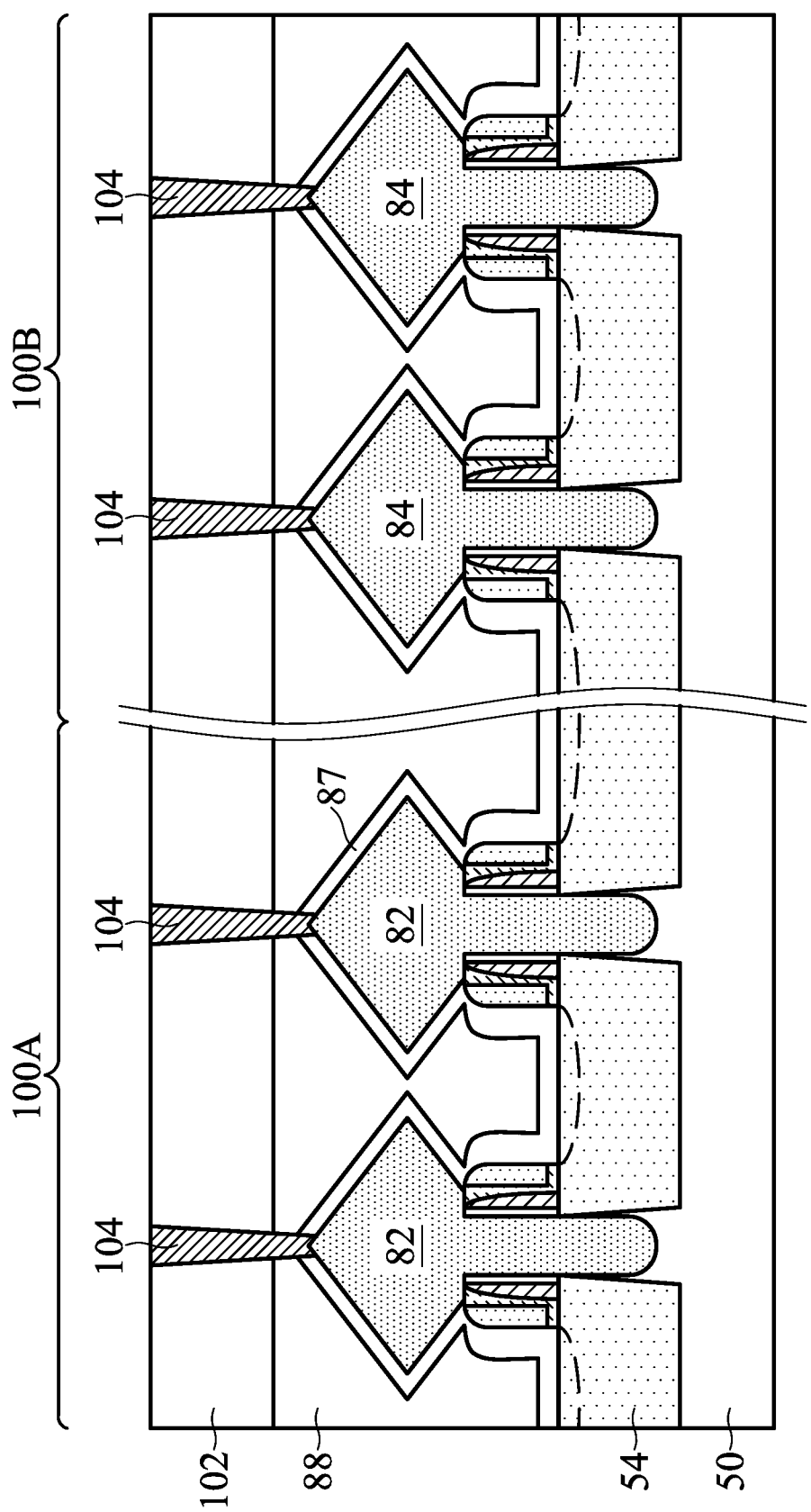

Referring to FIGS. 21A, 21B, and 21C, an ILD 102 is deposited over the ILD 88, contacts 104 are formed through the ILD 102 and the ILD 88, and contacts 110 are formed through the ILD 102. In an embodiment, the ILD 102 is formed using similar materials and methods as ILD 88, described above with reference to FIGS. 17A, 17B, and 17C, and the description is not repeated herein for the sake of brevity. In some embodiments, the ILD 102 and the ILD 88 are formed of a same material. In other embodiments, the ILD 102 and the ILD 88 are formed of different materials.

Openings for the contacts 104 are formed through the ILDs 88 and 102, and the etch stop layer 87. Openings for the contacts 110 are formed through the ILD 102 and the etch stop layer 87. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess materials from a top surface of the ILD 102. The remaining liner and conductive material form contacts 104 and 110 in the openings. In some embodiments, a silicide (not shown) may be formed at the interface between the epitaxial source/drain regions 82 and 84 and the contacts 104 prior to deposition of a liner. The contacts 104 are physically and electrically coupled to the epitaxial source/drain regions 82 and to the epitaxial source/drain regions 84, and the contacts 110 are physically and electrically coupled to the gate electrode 94 and the gate electrode 98. While the contacts 104 are depicted in FIG. 21B in a same cross-section as the contacts 110, this depiction is for purposes of illustration and in some embodiments the contacts 104 are disposed in different cross-sections from contacts 110.

FIGS. 22A, 22B, and 22C illustrated cross-sectional views of a FinFET device that is similar to the FinFET device illustrated in FIGS. 21A, 21B, and 21C, with like elements labeled with like numerical references. In some embodiments, the FinFET device of FIGS. 22A, 22B, and 22C may be formed using similar materials and methods and FinFET device of FIGS. 21A, 21B, and 21C, described above with reference to FIGS. 1-21C, and the description is not repeated herein for the sake of brevity. In the illustrated embodiment, two adjacent source/drain regions 82 and two adjacent source/drain regions 84 are merged to form respective common source/drain regions. In other embodiments, more than two adjacent source/drain regions 82 and more than two adjacent source/drain regions 84 may be merged.

Figure 23:
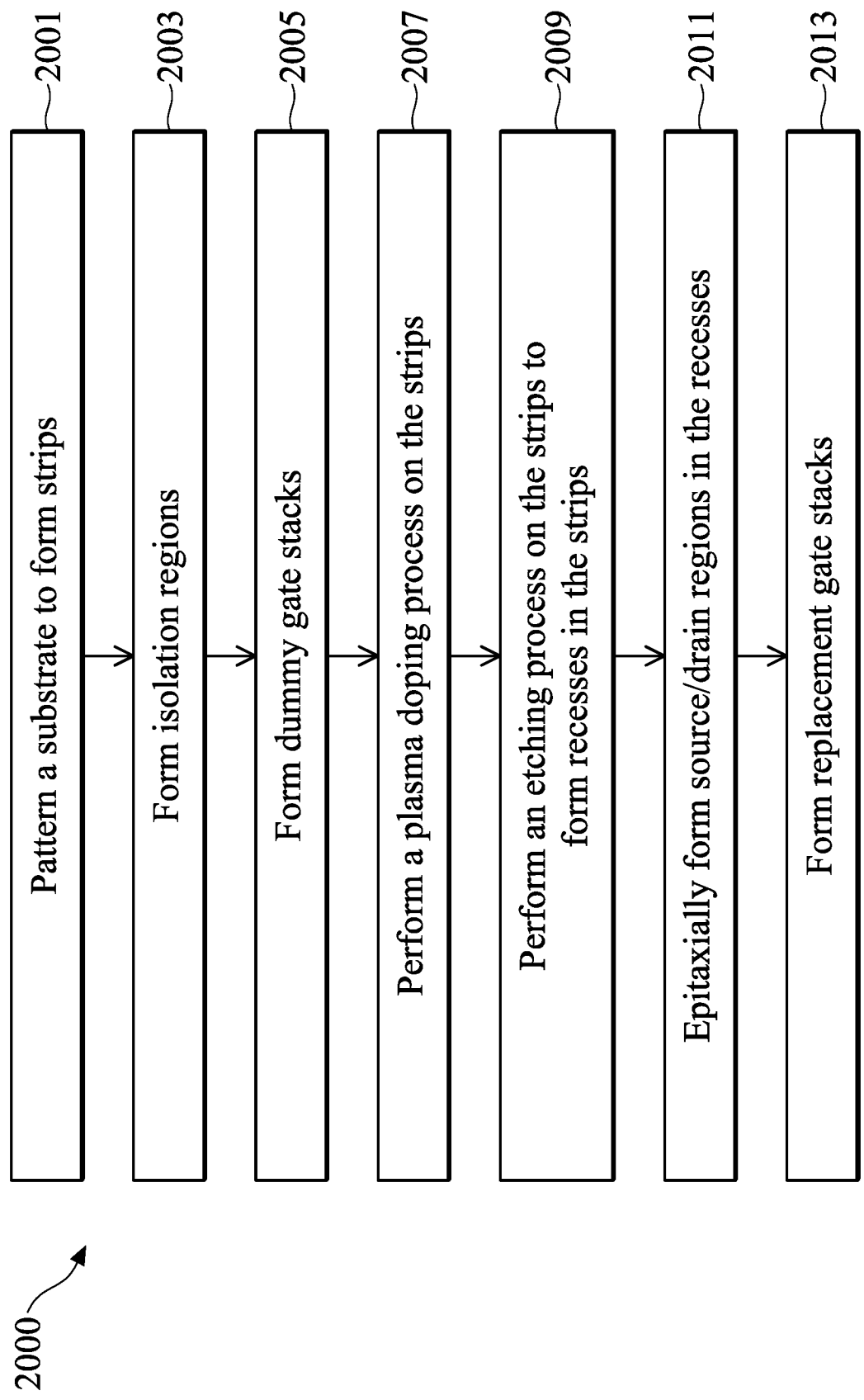
FIG. 23 is a flow diagram illustrating a method of forming a FinFET device in accordance with some embodiments.

FIG. 23 is a flow diagram illustrating a method of forming a FinFET device in accordance with some embodiments. The method 2000 starts with step 2001, where a substrate (such as the substrate 50 illustrated in FIG. 2) is patterned to form strips (such as the semiconductor strips 52 illustrated in FIG. 3) as described above with reference to FIGS. 2 and 3. In step 2003, isolation regions (such as the isolation regions 54 illustrated in FIG. 5) are formed between adjacent strips as described above with reference to FIGS. 4 and 5. In step 2005, dummy gate stacks (such as the dummy gate stacks 70 illustrated in FIGS. 7A and 7B) are formed over the strips as described above with reference to FIGS. 6A, 6B, and 7A-7C. In step 2007, a plasma doping process is performed on the strips to form doped regions (such as the doped regions 126 illustrated in FIGS. 10B-14) in the strips as described above with reference to FIGS. 10B-10C. In step 2009, an etching process is performed on the strips to form recesses (such as the recesses 128 illustrated in FIG. 15) in the strips as described above with reference to FIG. 15. In step 2011, source/drain regions (such as the epitaxial source/drain regions 82 illustrated in FIGS. 16B and 16C) are epitaxially grown in the recesses as described above with reference to FIGS. 16A-16C. In some embodiments, steps 2007, 2009, and 2011 are performed on strips disposed in a first region of the substrate where N-type devices are formed. In such embodiments, steps 2007, 2009, and 2011 may be repeated to be performed on strips disposed in a second region of the substrate where P-type devices are formed as described above with reference to FIGS. 17A-17C. In step 2013, replacement gate stacks (such as the gate dielectric layers 92/the gate electrodes 94 and the gate dielectric layers 96/the gate electrodes 98 illustrated in FIGS. 20A and 20B) are formed over the strips as described above with reference to FIGS. 19A-20C.

Various embodiments discussed herein allow for improved FinFET performance. For example, the plasma doping process described above with reference to FIG. 15 can allow a channel region beneath the gate stack to have a more uniform profile. By improving the uniformity of the channel region profile, the FinFET may turn on and turn off more uniformly across the channel, which can improve device speed, current uniformity, and efficiency.

In an embodiment, a method includes forming a fin over a substrate, forming a dummy gate structure over the fin, forming a first spacer over the dummy gate structure, implanting a first dopant in the fin to form a doped region of the fin adjacent the first spacer, removing the doped region of the fin to form a first recess, wherein the first recess is self-aligned to the doped region, and epitaxially growing a source/drain region in the first recess. In an embodiment, implanting the dopant in the fin includes a plasma doping process. In an embodiment, the first dopant is an N-type dopant. In an embodiment, the first dopant is arsenic. In an embodiment, the method further includes forming a second spacer over the first spacer. In an embodiment, the second spacer extends over the doped region. In an embodiment, the method further includes implanting a second dopant in the fin adjacent the dummy gate structure to form a lightly doped drain (LDD) region. In an embodiment, the method further includes annealing the doped region of the fin. In an embodiment, the doped region is removed using a plasma etch process.

In an embodiment, a method includes patterning a substrate to form a strip, the strip including a first semiconductor material, forming an isolation region along a sidewall of the strip, an upper portion of the strip extending above a top surface of the isolation region, and forming a dummy gate structure along sidewalls and along a first top surface of the upper portion of the strip. The method also includes performing a first doping process to form a first doped region of the strip, the first doped region extending from a second top surface of the upper portion of the strip to below a top surface of the isolation region, the second top surface of the upper portion of the strip being adjacent the dummy gate structure, performing a first etching process on the first doped region of the upper portion of the strip, wherein the first etching process selectively removes the first doped region to form a first recess, and epitaxially growing a source/drain region in the first recess. In an embodiment, the first etching process etches first portions of the strip within the first doped region at a greater rate than the first etching process etches second portions of the strip outside of the first doped region. In an embodiment, the first doping process further includes performing an anneal process. In an embodiment, the first doping process includes a plasma implant process. In an embodiment, the first doping process forms the first doped region by implanting arsenic. In an embodiment, the method includes forming a spacer along sidewalls of the dummy gate structure and over the first doped region. In an embodiment, the method further includes forming a spacer on the dummy gate structure.

In an embodiment, a semiconductor device includes a first semiconductor fin over a substrate, a gate stack overlying the first semiconductor fin, a spacer on a sidewall of the gate stack, and an epitaxial region within the first semiconductor fin and undercutting the spacer, the epitaxial region having a surface proximity measurement to tip proximity measurement difference of less than about 1%. In an embodiment, the spacer includes a nitride layer disposed over an oxide layer. In an embodiment, the epitaxial region completely undercuts the nitride layer of the spacer. In an embodiment, the first opening has a surface proximity measurement to tip proximity measurement difference of less than about 0.2 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first semiconductor fin over a substrate;
forming a gate stack overlying the first semiconductor fin;
forming a spacer on a sidewall of the gate stack;
doping the first semiconductor fin to form a first doped region, the first doped region extending under the spacer;
after forming the first doped region, doping the first semiconductor fin to form a second doped region, the second doped region extending below the first doped region;
removing the second doped region to form a recess in the first semiconductor fin, the recess extending under the spacer, wherein portions of the first doped region are adjacent the recess; and
growing an epitaxial region in the recess.

2. The method of claim 1, wherein a lateral offset between a sidewall of the recess near the top of the recess and a sidewall of the recess halfway between the top of the recess and the bottom of the recess is less than 0.2 nm.

3. The method of claim 1, wherein doping the first semiconductor fin to form the second doped region comprises implanting an N-type dopant.

4. The method of claim 3, wherein the N-type dopant is arsenic.

5. The method of claim 1, wherein doping the first semiconductor fin to form the second doped region comprises performing a plasma doping process.

6. The method of claim 1 further comprising, after doping the first semiconductor fin to form the second doped region, performing an anneal on the second doped region.

7. The method of claim 1, wherein removing the second doped region comprises performing a plasma etching process.

8. The method of claim 1, wherein the first doped region extends farther laterally under the spacer than the second doped region.

9. A method comprising:
forming a fin over a substrate;
forming a dummy gate structure over the fin;
after forming the dummy gate structure, implanting a first dopant in the fin using a first process;
after implanting the first dopant, forming a first spacer layer on a sidewall of the dummy gate structure;
after forming the first spacer layer, implanting a second dopant in the fin to form a first doped region of the fin, wherein the first doped region has a first concentration of the second dopant, wherein the first doped region of the fin is adjacent the first spacer layer; wherein the second dopant is different than the first dopant; wherein the second dopant is implanted using a second process that is different than the first process;
after implanting the second dopant in the fin, forming a second spacer layer on the first spacer layer, wherein the second spacer layer extends over the first doped region;
etching the first doped region of the fin to form a first recess in the fin, wherein portions of the fin adjacent the first recess have a second concentration of the second dopant that is less than the first concentration, and wherein the first recess extends under the second spacer layer; and
epitaxially growing a source/drain region in the first recess.

10. The method of claim 9, wherein the second concentration of the second dopant is zero.

11. The method of claim 9, wherein the sidewalls of the first recess extending from the top of the first recess to half the depth of the first recess are vertical.

12. The method of claim 9 further comprising annealing the first doped region of the fin.

13. The method of claim 9, wherein the first recess extends completely under the second spacer layer.

14. The method of claim 9, wherein etching the first doped region of the fin comprises performing an etching process in which portions of the first doped region having the first concentration of the second dopant are etched at a greater rate than portions of the first doped region having a concentration of the second dopant that is less than the first concentration.

15. The method of claim 9, wherein the second process comprises a plasma implantation process.

16. The method of claim 9, wherein the second dopant is arsenic.

17. A method comprising:
patterning a semiconductor substrate to form a strip;
forming an isolation region surrounding the strip, wherein the strip protrudes from the isolation region;
forming a dummy gate structure along sidewalls and over the strip;
forming a first spacer on a sidewall of the dummy gate structure;
implanting a first dopant in the strip to form a laterally-doped drain (LDD) region adjacent the dummy gate structure;
after implanting the first dopant, implanting a second dopant in a first portion of the LDD region;
removing the first portion of the LDD region to form a recess in the strip, wherein sidewalls of the LDD region are exposed within the recess, wherein after removing the first portion of the LDD region, the LDD region is free of the second dopant; and
epitaxially growing a source/drain region in the recess.

18. The method of claim 17, wherein implanting the second dopant comprises implanting the second dopant below the LDD region.

19. The method of claim 18, wherein implanting the second dopant comprises implanting the second dopant to a depth that is below a top surface of the isolation region.

20. The method of claim 17 further comprising, after implanting the first dopant, forming a second spacer on the first spacer.

* * * * *